(12) United States Patent
Seo et al.

(10) Patent No.: US 12,170,259 B2
(45) Date of Patent: Dec. 17, 2024

(54) SEMICONDUCTOR PACKAGE AND METHOD OF FABRICATING THE SAME

(71) Applicant: SAMSUNG ELECTRONICS CO., LTD., Suwon-si (KR)

(72) Inventors: Ju Bin Seo, Seongnam-si (KR); Seok Ho Kim, Hwaseong-si (KR); Kwang Jin Moon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 351 days.

(21) Appl. No.: 17/715,103

(22) Filed: Apr. 7, 2022

(65) Prior Publication Data

US 2023/0060360 A1 Mar. 2, 2023

(30) Foreign Application Priority Data

Sep. 1, 2021 (KR) .................. 10-2021-0116317

(51) Int. Cl.
*H01L 23/00* (2006.01)
*H01L 21/66* (2006.01)
(Continued)

(52) U.S. Cl.
CPC .............. *H01L 24/08* (2013.01); *H01L 22/32* (2013.01); *H01L 24/03* (2013.01); *H01L 24/05* (2013.01); *H01L 24/80* (2013.01); *H01L 25/0652* (2013.01); *H01L 25/0657* (2013.01); *H01L 23/49816* (2013.01); *H01L 23/49833* (2013.01); *H01L 24/16* (2013.01); *H01L 24/32* (2013.01); *H01L 24/73* (2013.01); *H01L 2224/039* (2013.01); *H01L 2224/05124* (2013.01); *H01L 2224/05647* (2013.01); *H01L 2224/05687* (2013.01); *H01L 2224/0801* (2013.01);
(Continued)

(58) Field of Classification Search
None
See application file for complete search history.

(56) References Cited

U.S. PATENT DOCUMENTS 10,811,390 B2 10/2020 Chen et al.
10,867,929 B2 12/2020 Yu et al.
(Continued)

FOREIGN PATENT DOCUMENTS

KR 10-2000-0027568 A 5/2000

*Primary Examiner* — Asok K Sarkar
(74) *Attorney, Agent, or Firm* — Muir Patent Law, PLLC

(57) ABSTRACT

A semiconductor package that include first and second semiconductor chips bonded together, wherein the first semiconductor chip includes a first semiconductor substrate, a first semiconductor element layer and a first wiring structure sequentially stacked on a first surface of the first semiconductor substrate, first connecting pads and first test pads on the first wiring structure, and first front-side bonding pads, which are connected to the first connecting pads, wherein the second semiconductor chip includes a second semiconductor substrate, a second semiconductor element layer and a second wiring structure sequentially stacked on a third surface of the second semiconductor substrate, and first back-side bonding pads bonded to the first front-side bonding pads on the fourth surface of the second semiconductor substrate, and wherein the first test pads are not electrically connected to the second semiconductor chip.

20 Claims, 25 Drawing Sheets

(51) Int. Cl.
*H01L 25/065* (2023.01)
*H01L 23/498* (2006.01)

(52) U.S. Cl.
CPC .............. *H01L 2224/08057* (2013.01); *H01L 2224/08147* (2013.01); *H01L 2224/08237* (2013.01); *H01L 2224/16227* (2013.01); *H01L 2224/16238* (2013.01); *H01L 2224/32225* (2013.01); *H01L 2224/73204* (2013.01); *H01L 2224/80895* (2013.01); *H01L 2224/80896* (2013.01); *H01L 2225/06524* (2013.01); *H01L 2225/06541* (2013.01); *H01L 2225/06548* (2013.01); *H01L 2225/06596* (2013.01); *H01L 2924/1431* (2013.01); *H01L 2924/1434* (2013.01); *H01L 2924/3511* (2013.01)

(56) References Cited

U.S. PATENT DOCUMENTS

| | | | | |
|---|---|---|---|---|
| 2010/0264551 | A1* | 10/2010 | Farooq | H01L 25/50 |
| | | | | 438/109 |
| 2013/0049213 | A1* | 2/2013 | Scheuermann | H01L 23/522 |
| | | | | 257/774 |
| 2018/0277497 | A1* | 9/2018 | Matsuo | H01L 25/0657 |
| 2019/0123022 | A1* | 4/2019 | Teig | H01L 25/0657 |
| 2019/0131277 | A1 | 5/2019 | Yang et al. | |
| 2021/0057332 | A1 | 2/2021 | Chen et al. | |
| 2021/0066222 | A1 | 3/2021 | Chen et al. | |
| 2021/0066252 | A1 | 3/2021 | Chen et al. | |
| 2021/0082846 | A1 | 3/2021 | Lin et al. | |
| 2021/0104482 | A1 | 4/2021 | Hong et al. | |
| 2021/0125966 | A1* | 4/2021 | Shih | H01L 24/19 |
| 2022/0208748 | A1* | 6/2022 | Rabkin | H01L 24/80 |

\* cited by examiner

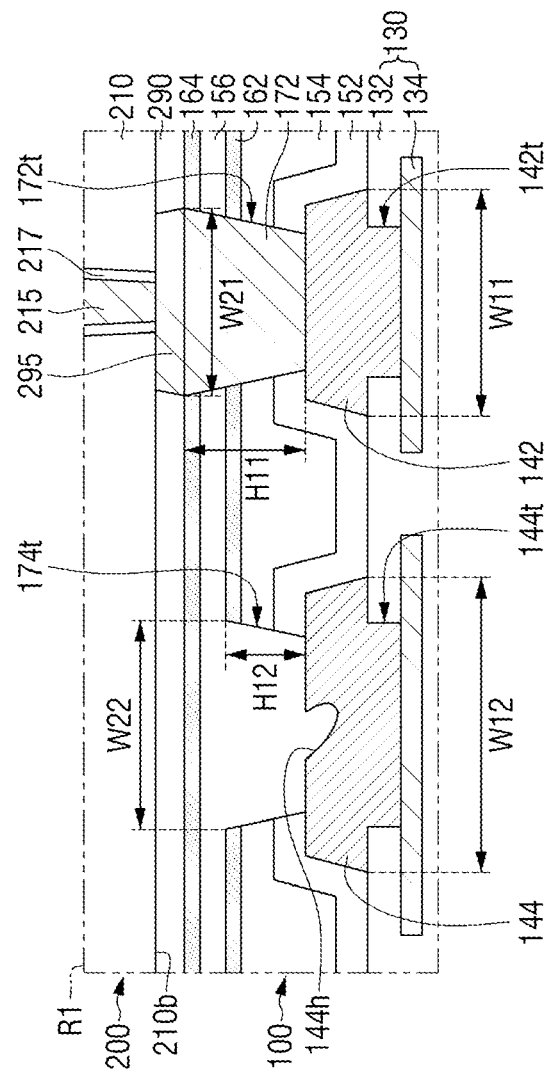

SEMICONDUCTOR PACKAGE AND METHOD OF FABRICATING THE SAME

CROSS-REFERENCE TO RELATED APPLICATION

This application claims priority to Korean Patent Application No. 10-2021-0116317, filed on Sep. 1, 2021, and all the benefits accruing therefrom under 35 U.S.C. § 119, the disclosure of which is incorporated herein by reference in its entirety.

BACKGROUND

1. Field

The present disclosure relates to a semiconductor package and a method of fabricating the same, and more particularly, to a semiconductor package including semiconductor chips that are stacked in a die-to-wafer (D2W) manner and a method of fabricating the semiconductor package.

2. Description of the Related Art

With rapid developments in the electronics industry and a variety of user demands, electronic devices have increasingly become smaller, lighter, and more multifunctional. Semiconductor packages for use in such electronic devices are being required to have not only a compact size and light weight, but also multifunctionality. For example, two or more types of semiconductor chips may be incorporated into a single semiconductor package, so that the size of the semiconductor package may be considerably reduced, and yet, the storage capacity and the functionality of the semiconductor package may both be improved.

In order to increase the storage capacity of a semiconductor package, semiconductor chips may be stacked in a Chip-on-Wafer (CoW) method or a Die-to-Wafer (D2W) method. The CoW method may refer to a method in which a semiconductor chip is stacked on a wafer (or another semiconductor chip) via connecting members, e.g., bumps or solder. The D2W method may refer to a method in which a semiconductor chip is stacked on a wafer (or another semiconductor chip) via pad-to-pad bonding or bonding using an anisotropic conductive film (ACF).

SUMMARY

According to an embodiment of the present disclosure, there is provided a semiconductor package including first and second semiconductor chips bonded together, wherein the first semiconductor chip includes a first semiconductor substrate, which has first and second surfaces that are opposite to each other, a first semiconductor element layer and a first wiring structure, which are sequentially stacked on the first surface of the first semiconductor substrate, first connecting pads and first test pads, which are connected to the first wiring structure, on the first wiring structure, and first front-side bonding pads, which are connected to the first connecting pads, the second semiconductor chip includes a second semiconductor substrate, which has a third surface and a fourth surface that is opposite to the third surface and faces the first surface, a second semiconductor element layer and a second wiring structure, which are sequentially stacked on the third surface of the second semiconductor substrate, and first back-side bonding pads, which are bonded to the first front-side bonding pads, on the fourth surface of the second semiconductor substrate, and the first test pads are not electrically connected to the second semiconductor chip.

According to an embodiment of the present disclosure, there is provided a semiconductor package including a semiconductor substrate having first and second surfaces, which are opposite to each other, a semiconductor element layer and a wiring structure sequentially stacked on the first surface of the semiconductor substrate, connecting pads connected to the wiring structure, on a top surface of the wiring structure, test pads spaced apart from the connecting pads and connected to the wiring structure, on the top surface of the wiring structure, first and second liner films sequentially stacked on the top surface of the wiring structure, connecting pad openings exposing the connecting pads through the first and second liner films, test pad openings exposing the test pads through the first liner film, and not penetrating the second liner film, and front-side bonding pads connected to the connecting pads in the connecting pad openings.

According to an embodiment of the present disclosure, there is provided a semiconductor package including a base substrate, and a plurality of semiconductor chips sequentially stacked on the base substrate, wherein each of the semiconductor chips includes a semiconductor substrate, which has a first surface that faces a top surface of the base substrate and a second surface that is opposite to the first surface, a semiconductor element layer and a wiring structure, which are sequentially stacked on the first surface of the semiconductor substrate, connecting pads and test pads, which are connected to the wiring structure and are exposed from the wiring structure, front-side bonding pads, which are connected to the connecting pads and are not connected to the test pads, back-side bonding pads, which are on the second surface of the semiconductor substrate, and through vias, which connect the wiring structure and the back-side bonding pads through the semiconductor substrate.

According to the aforementioned and other embodiments of the present disclosure, there is provided a method of fabricating a semiconductor package, including providing a first semiconductor substrate, which has first and second surfaces that are opposite to each other, sequentially forming a first semiconductor element layer and a first wiring structure on the first surface of the first semiconductor substrate, forming first connecting pads and first test pads, which are connected to the first wiring structure, on the first wiring structure, forming a first liner film on the first wiring structure, the first connecting pads, and the firsts test pads, forming test pad openings, which expose the first test pads through the first liner film, forming a second liner film on the first liner film, and forming front-side bonding pads, which are connected to the first connecting pads through the first and second liner films.

BRIEF DESCRIPTION OF THE DRAWINGS

Features will become apparent to those of skill in the art by describing in detail exemplary embodiments with reference to the attached drawings, in which:

FIGS. 2A and 2B are enlarged cross-sectional views of area R1 of FIG. 1.

DETAILED DESCRIPTION

A semiconductor package according to some embodiments of the present disclosure will hereinafter be described with reference to FIGS. 1 through 10.

Figure 1:
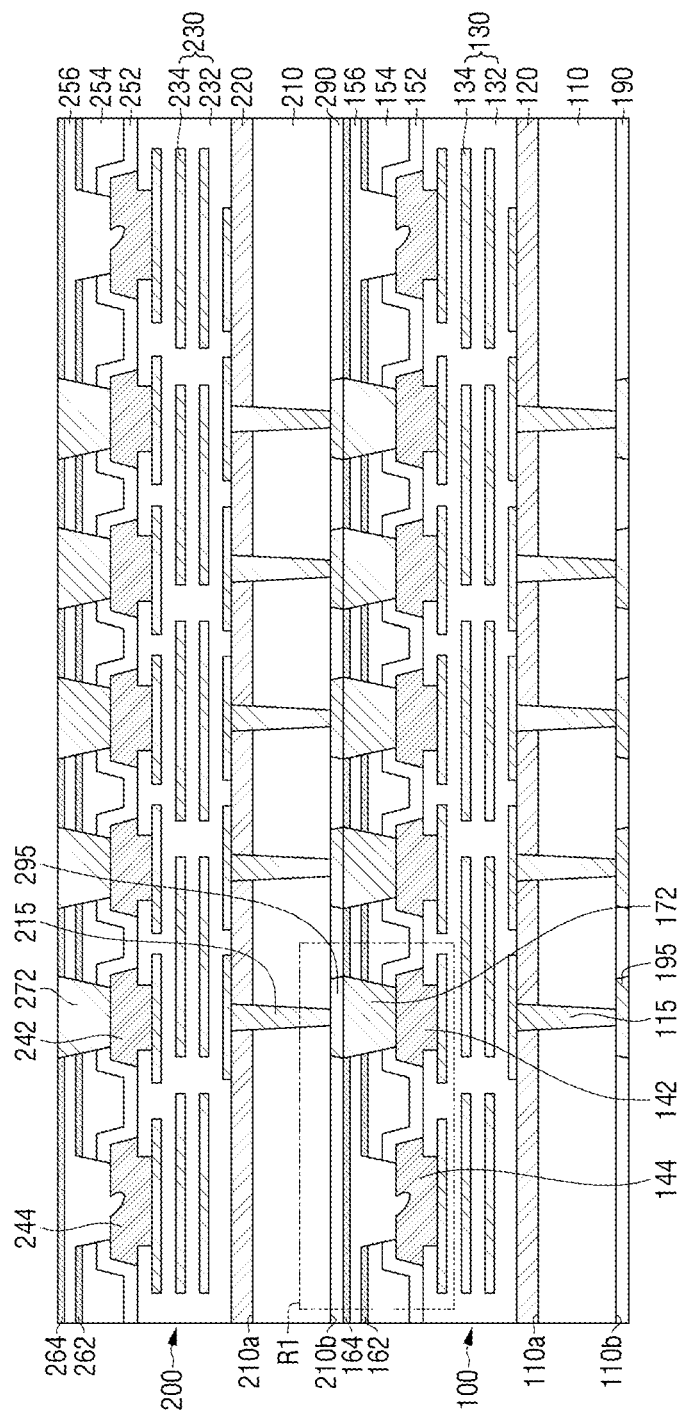
FIG. 1 is a cross-sectional view of a semiconductor package according to some embodiments of the present disclosure.
Figure 2B:
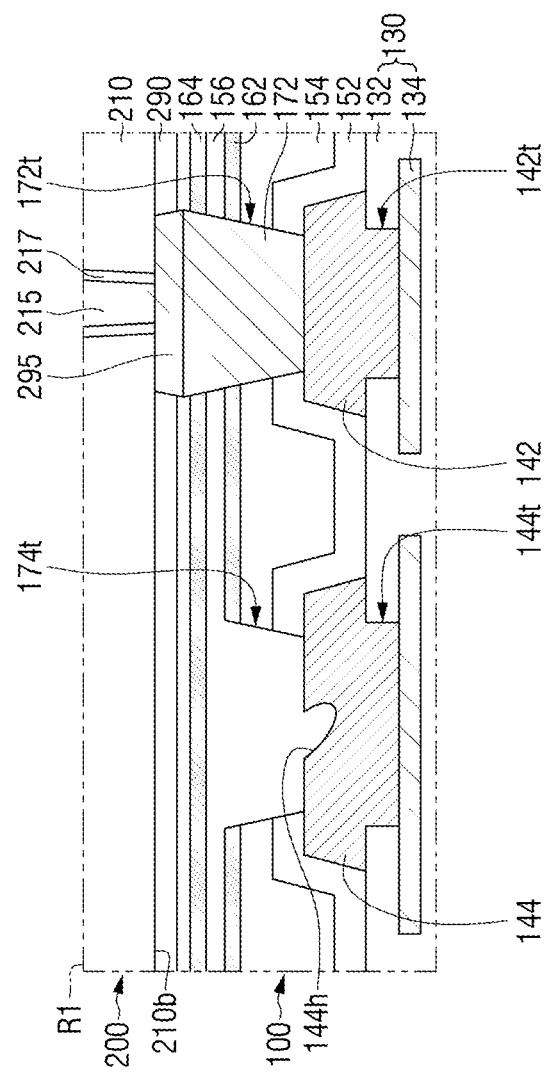
Figure 3A:
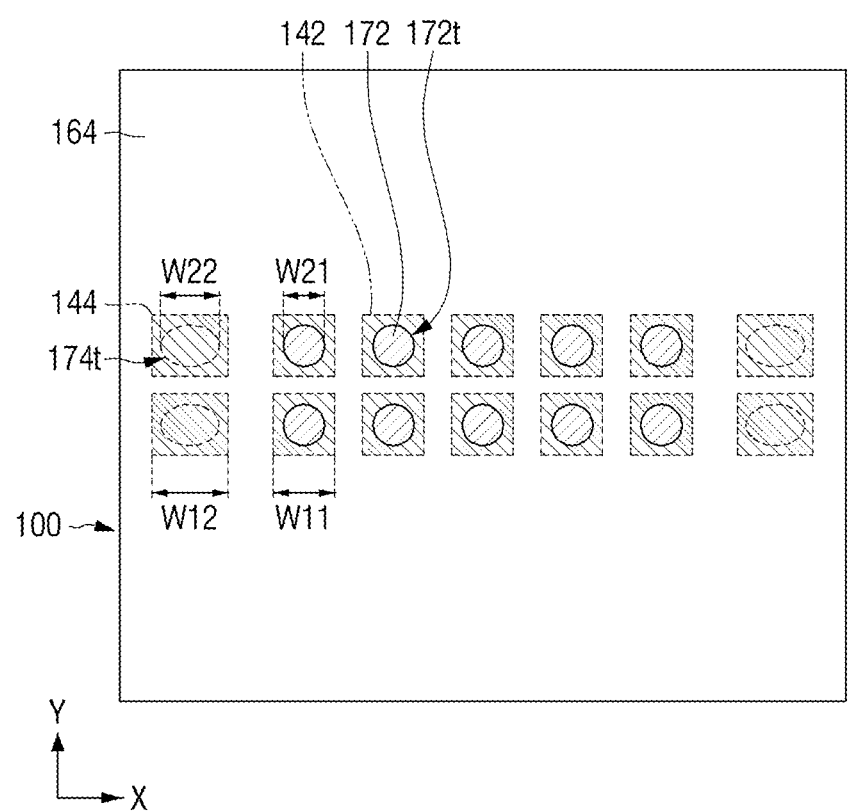
FIGS. 3A and 3B are plan views of first connecting pads and first test pads of FIG. 1.
Figure 3B:
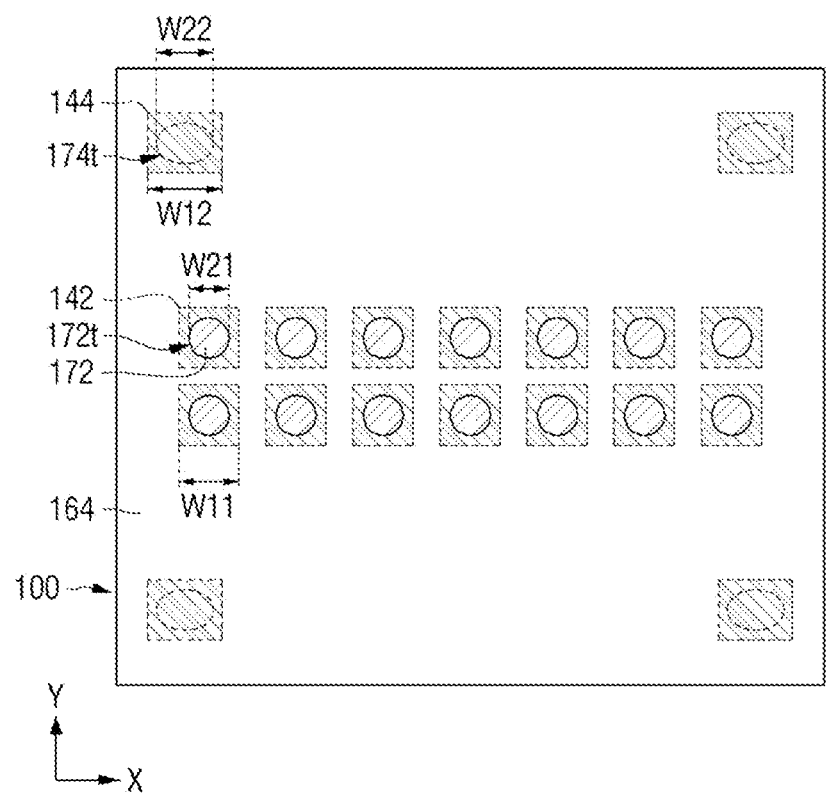

FIG. 1 is a cross-sectional view of a semiconductor package according to some embodiments of the present disclosure. FIGS. 2A and 2B are enlarged cross-sectional views of area R1 of FIG. 1. FIGS. 3A and 3B are plan views illustrating first connecting pads and first test pads of FIG. 1.

Referring to FIGS. 1 through 3B, a semiconductor package according to some embodiments of the present disclosure may include a first semiconductor chip 100 and a second semiconductor chip 200. Each of the first and second semiconductor chips 100 and 200 may be an integrated circuit (IC) obtained by integrating hundreds to millions of semiconductor elements into a single chip.

For example, the first and second semiconductor chips 100 and 200 may be application processors (APs), e.g., central processing units (CPUs), graphics processing units (GPUs), field-programmable gate arrays (FPGAs), digital signal processors (DSPs), cryptographic processors, microprocessors, microcontrollers, or application-specific ICs (ASICs). In another example, the first and second semiconductor chips 100 and 200 may be volatile memories, e.g., dynamic random-access memories (DRAMs) or static random-access memories (SRAMs), or nonvolatile memories, e.g., flash memories, phase-change random-access memories (PRAMs), magnetoresistive random-access memories (MRAMs), ferroelectric random-access memories (FeRAMs), or resistive random-access memories (RRAMs). In some embodiments, the first and second semiconductor chips 100 and 200 may form a multi-chip semiconductor package, e.g., a high-bandwidth memory (HBM).

The first semiconductor chip 100 may include a first semiconductor substrate 110, first through vias 115, a first semiconductor element layer 120, a first wiring structure 130, first connecting pads 142, first test pads 144, a first passivation film 152, a first interlayer insulating film 154, a first liner film 162, a second interlayer insulating film 156, a second liner film 164, first front-side bonding pads 172, a first back-side insulating film 190, and first back-side bonding pads 195.

The first semiconductor substrate 110 may be, e.g., a bulk silicon substrate or a silicon-on-insulator (SOI) substrate. Alternatively, the first semiconductor substrate 110 may be a silicon substrate or may include, e.g., silicon germanium, a silicon germanium-on-insulator (SGOI), indium antimonide, lead tellurium compound, indium arsenide, indium phosphide, gallium arsenide, or gallium antimonide.

The first semiconductor substrate 110 may have first and second surfaces 110a and 110b, which are opposite to each other. The first surface 110a of the first semiconductor substrate 110 may be an active surface where the first semiconductor element layer 120 is formed. In the description that follows, the first surface 110a of the first semiconductor substrate 110 may also be referred to as the front side of the first semiconductor substrate 110, and the second surface 110b of the first semiconductor substrate 110 may also be referred to as the back side of the first semiconductor substrate 110.

The first semiconductor element layer 120 may be formed on the first surface 110a of the first semiconductor substrate 110. The first semiconductor element layer 120 may include various fine electronic elements, e.g., metal-oxide-semiconductor field-effect transistors (MOSFETs) (e.g., complementary metal-oxide-semiconductor (CMOS) transistors), system large-scale integration (LSI), flash memories, DRAMs, SRAMs, electrically erasable programmable read-only memories (EEPROMs), PRAMs, MRAMs, RRAMs, image sensors (e.g., CMOS imaging sensors), micro-electro-mechanical systems (MEMSs), active elements, and passive elements.

The first wiring structure 130 may cover the first semiconductor element layer 120. The first wiring structure 130 may be electrically connected to the first semiconductor element layer 120. For example, the first wiring structure 130 may include a first inter-wiring insulating film 132 and first wiring patterns 134, which are disposed in the first inter-wiring insulating film 132. The first wiring patterns 134 may form a multilayer structure and may be electrically connected to the first semiconductor element layer 120. The layout of the first wiring patterns 134, the number of first wiring patterns 134, and the number of layers formed by the first wiring patterns 134 are merely exemplary and are not particularly limited.

For example, the first wiring patterns 134 may include conductive films and barrier films, which are disposed between the first inter-wiring insulating film 132 and the conductive films. The conductive films may include at least one of, e.g., tungsten (W), aluminum (Al), and copper (Cu). The barrier films may include at least one of, e.g., titanium (Ti), titanium nitride (TiN), tantalum (Ta), and tantalum nitride (TaN).

The first through vias 115 may penetrate the first semiconductor substrate 110. The first through vias 115 may be electrically connected to the first wiring structure 130. For example, the first through vias 115 may be connected to a lowermost layer of first wiring patterns 134 through the first semiconductor substrate 110 and the first semiconductor element layer 120. The first through vias 115 may include at least one of, e.g., Cu, a Cu alloy (e.g., CuSn, CuMg, CuNi, CuZn, CuPd, CuAu, CuRe, or CuW), W, a W alloy, nickel (Ni), ruthenium (Ru), and cobalt (Co).

The first connecting pads 142 and the first test pads 144 may be spaced apart from one another and may be formed on the first wiring structure 130. The first connecting pads 142 and the first test pads 144 may be electrically connected to the first wiring structure 130. For example, first wiring trenches 142t, which expose parts of an uppermost layer of first wiring patterns 134, may be formed in the first inter-wiring insulating film 132. At least parts of the first connecting pads 142 may be formed in the first inter-wiring insulating film 132 and may be connected to the first wiring patterns 134. For example, second wiring trenches 144t, which expose other parts of the uppermost layer of first wiring patterns 134, may be formed in the first inter-wiring insulating film 132. At least parts of the first test pads 144 may be formed in the second wiring trenches 144t and may be connected to the first wiring patterns 134.

The numbers of first connecting pads 142 and first test pads 144 and the layouts of the first connecting pads 142 and the first test pads 144 are merely exemplary and are not particularly limited. For example, as illustrated in FIG. 3A, the first connecting pads 142 may be arranged in a lattice form on an X-Y plane, e.g., in a two-dimensional matrix pattern along the X and Y directions. A plurality of first test pads 144 may be disposed on both sides of each array of first connecting pads 142, e.g., a plurality of first test pads 144 may be positioned at each of two opposite ends of the matrix pattern of the first connecting pads 142. In another example, as illustrated in FIG. 3B, four first test pads 144 may be arranged near the four corners of the first semiconductor chip 100.

For example, as illustrated in FIG. 1, first wiring patterns 134 connected to the first connecting pads 142 and first wiring patterns 134 connected to the first test pads 144 may not being connected to one another. In another example, the first wiring patterns 134 connected to the first connecting pads 142 may be electrically connected to the first wiring patterns 134 connected to the first test pads 144.

The first connecting pads 142 and the first test pads 144 may include at least one of, e.g., W, Al, and Cu. For example, the first connecting pads 142 and the first test pads 144 may include Al.

For example, as illustrated in FIG. 2A, the top surfaces of the first test pads 144 may include grooves 144h. The grooves 144h of the first test pads 144 may be formed during a test process for the first semiconductor chip 100. This will be described later with reference to FIG. 14.

As illustrated in FIGS. 1 and 2A, the first connecting pads 142 and the first test pads 144 may protrude from, e.g., above, the first wiring structure 130. For example, the top surfaces of the first connecting pads 142 and the top surfaces of the first test pads 144 may be formed to be higher than the top surface of the first wiring structure 130, e.g., relative to the first semiconductor element layer 120. As a result, the first connecting pads 142 and the first test pads 144 may be exposed from the first wiring structure 130.

Referring to FIG. 2A, a width W11 of the first connecting pads 142 and a width W12 of the first test pads 144 may be, e.g., about 100 μm. For example, the width W11 of the first connecting pads 142 and the width W12 of the first test pads 144 may be about 10 μm to about 70 μm. The width W11 of the first connecting pads 142 may be greater than the width of the first wiring trenches 142t, and the width W12 of the first test pads 144 may be greater than the width of the second wiring trenches 144t. In some embodiments, the width W12 of the first test pads 144 may be greater than the width W11 of the first connecting pads 142. As illustrated in FIG. 2A, each of the widths W11 and W12 refers to a maximal width measured at a widest part between facing sidewalls of a corresponding one of the first connecting pads 142 and the first test pads 144, e.g., along an uppermost surface of the first wiring structure 130.

The first passivation film 152 may be formed on the first wiring structure 130, the first connecting pads 142, and the first test pads 144. For example, the first passivation film 152 may be formed conformally along the profiles of the first wiring structure 130, the first connecting pads 142, and the first test pads 144. The first passivation film 152 may protect the first connecting pads 142 and the first test pads 144 from external shock or moisture. The first passivation film 152 may include at least one of, e.g., silicon oxide, silicon nitride, and silicon oxynitride.

The first interlayer insulating film 154 may be formed on the first passivation film 152. The first interlayer insulating film 154 may cover the top surface of the first passivation film 152. In some embodiments, the first interlayer insulating film 154 may have a planarized top surface. For example, the top surface of the first interlayer insulating film 154 may extend in parallel to the uppermost top surface of the first wiring structure 130. The first interlayer insulating film 154 may include at least one of, e.g., silicon oxide, silicon nitride, and silicon oxynitride. For example, the first interlayer insulating film 154 may include tetraethyl orthosilicate (TEOS).

The first liner film 162 may be formed on the first interlayer insulating film 154. The first liner film 162 may cover the top surface of the first interlayer insulating film 154. In some embodiments, the first liner film 162 may extend conformally along the planarized top surface of the first interlayer insulating film 154. The first liner film 162 may include at least one of, e.g., silicon oxide, silicon nitride, and silicon oxynitride.

In some embodiments, the first liner film 162 may include a different material from the first interlayer insulating film 154. For example, the first interlayer insulating film 154 may include a silicon oxide film, and the first liner film 162 may include a silicon nitride film.

The first passivation film 152, the first interlayer insulating film 154, and the first liner film 162 may expose the first test pads 144. For example, test pad openings 174t, which expose at least parts of the top surfaces of the first test pads 144 through the first passivation film 152, the first interlayer insulating film 154, and the first liner film 162, may be formed. As illustrated in FIGS. 3A and 3B, the test pad openings 174t (e.g., elliptical dashed lines) may overlap with at least parts of the first test pads 144 (e.g., hatched rectangles overlapping the dashed elliptical lines) in a plan view.

The second interlayer insulating film 156 may be formed on the first liner film 162. The second interlayer insulating film 156 may cover the top surface of the first liner film 162. In some embodiments, the second interlayer insulating film 156 may have a planarized top surface. For example, the top surface of the second interlayer insulating film 156 may extend in parallel to the uppermost top surface of the first wiring structure 130. The second interlayer insulating film 156 may include at least one of, e.g., silicon oxide, silicon nitride, and silicon oxynitride. For example, the second interlayer insulating film 156 may include TEOS.

In some embodiments, parts of the second interlayer insulating film 156 may be in contact with the first test pads 144 through the first passivation film 152, the first interlayer insulating film 154, and the first liner film 162. For example, as illustrated in FIGS. 2A and 2B, parts of the second interlayer insulating film 156 may fill the test pad openings 174t.

The second liner film 164 may be formed on the second interlayer insulating film 156. The second liner film 164 may cover the top surface of the second interlayer insulating film 156. In some embodiments, the second liner film 164 may extend conformally along the planarized top surface of the second interlayer insulating film 156. The second liner film 164 may include at least one of, e.g., silicon oxide, silicon nitride, and silicon oxynitride.

In some embodiments, the second liner film 164 may include a different material from the second interlayer insulating film 156. For example, the second interlayer insulating film 156 may include a silicon oxide film, and the second liner film 164 may include a silicon nitride film.

In some embodiments, the first and second liner films 162 and 164 may include different materials. For example, the first liner film 162 may include a SiN film, and the second liner film 164 may include a SiCN film.

The first passivation film 152, the first interlayer insulating film 154, the first liner film 162, the second interlayer insulating film 156, and the second liner film 164 may expose the first connecting pads 142. For example, connecting pad openings 172t, which expose at least parts of the top surfaces of the first connecting pads 142 through the first passivation film 152, the first interlayer insulating film 154, the first liner film 162, the second interlayer insulating film 156, and the second liner film 164, may be formed. As illustrated in FIGS. 3A and 3B, the connecting pad openings 172t (e.g., solid curved lines) may overlap with at least parts of the first connecting pads 142 (e.g., hatched rectangles overlapping the solid curved lines) in a plan view.

In some embodiments, the test pad openings 174t, unlike the connecting pad openings 172t, may not penetrate the second interlayer insulating film 156 and the second liner film 164. That is, the test pad openings 174t may be formed in the first passivation film 152, the first interlayer insulating film 154, and the first liner film 162, but not in the second interlayer insulating film 156 and the second liner film 164.

The first front-side bonding pads 172 may be formed on the first connecting pads 142. The first front-side bonding pads 172 may be connected to the first connecting pads 142 through the first passivation film 152, the first interlayer insulating film 154, the first liner film 162, the second interlayer insulating film 156, and the second liner film 164. For example, the first front-side bonding pads 172 may be formed in the connecting pad openings 172t and may be connected to the first connecting pads 142. The first front-side bonding pads 172 may be exposed from the second liner film 164. For example, the top surfaces of the first front-side bonding pads 172 may be disposed on the same plane as the top surface of the second liner film 164, e.g., top surfaces of the first front-side bonding pads 172 and the second liner film 164 may face a same direction and may be coplanar.

The first front-side bonding pads 172 may be connected to the first test pads 144. For example, as already mentioned above, parts of the second interlayer insulating film 156 may fill the test pad openings 174t.

The first front-side bonding pads 172 may include at least one of, e.g., W, Al, and Cu. Preferably, the first front-side bonding pads 172 may include Cu.

For example, a width W21 of the first front-side bonding pads 172 may be about 10 μm or less, e.g., about 5 μm to about 10 μm. In some embodiments, a width W22 of the test pad openings 174t may be greater than the width W21 of the first front-side bonding pads 172. As illustrated in FIG. 2A, each of the widths W21 and W22 refers to a maximal width measured at a widest part between facing sidewalls of a corresponding one of the first front-side bonding pads 172 and test pad openings 174t.

For example, a height H11 of the first front-side bonding pads 172 may be about 5 μm or less, e.g., about 3 μm to about 5 μm. As the first front-side bonding pads 172 penetrate the second interlayer insulating film 156 and the second liner film 164 beyond the first liner film 162, the height H11 of the first front-side bonding pads 172 may be greater than a height H12 of the first dummy pads 174.

The first back-side insulating film 190 may be formed on the second surface 110b of the first semiconductor substrate 110. The first back-side insulating film 190 may cover the second surface 110b of the first semiconductor substrate 110. The first back-side insulating film 190 may include at least one of, e.g., silicon oxide, silicon nitride, and silicon oxynitride. In some embodiments, the first back-side insulating film 190 may include a silicon oxide film.

The first back-side bonding pads 195 may be formed on the second surface 110b of the first semiconductor substrate 110. The first back-side bonding pads 195 may be exposed from e.g., through, the first back-side insulating film 190. For example, the bottom surfaces of the first back-side bonding pads 195 may be disposed on the same plane as the bottom surface of the first back-side insulating film 190, e.g., the first back-side bonding pads 195 may penetrate through an entire thickness of the first back-side insulating film 190 to have a same thickness as the first back-side insulating film 190 and to have bottom surfaces coplanar with those of the first back-side insulating film 190.

The first back-side bonding pads 195 may be electrically connected to the first through vias 115. For example, the first through vias 115 may be, e.g., directly, connected to the top surfaces of the first back-side bonding pads 195 through the first semiconductor substrate 110. The first back-side bonding pads 195 may be electrically connected to the first wiring structure 130 and/or the first semiconductor element layer 120 through the first through vias 115.

The first back-side bonding pads 195 may include at least one of, e.g., W, Al, and Cu. For example, the first back-side bonding pads 195 may include Cu.

The second semiconductor chip 200 may include a second semiconductor substrate 210, second through vias 215, a second semiconductor element layer 220, a second wiring structure 230, second connecting pads 242, second test pads 244, a second passivation film 252, a third interlayer insulating film 254, a third liner film 262, a fourth interlayer insulating film 256, a fourth liner film 264, second front-side bonding pads 272, a second back-side insulating film 290, and second back-side bonding pads 295. The second semiconductor substrate 210, the second through vias 215, the second semiconductor element layer 220, the second wiring structure 230, the second connecting pads 242, the second test pads 244, the second passivation film 252, the third interlayer insulating film 254, the third liner film 262, the fourth interlayer insulating film 256, the fourth liner film 264, the second front-side bonding pads 272, the second back-side insulating film 290, and the second back-side bonding pads 295 may correspond to the first semiconductor substrate 110, the first through vias 115, the first semiconductor element layer 120, the first wiring structure 130, the first connecting pads 142, the first test pads 144, the first passivation film 152, the first interlayer insulating film 154, the first liner film 162, the second interlayer insulating film 156, the second liner film 164, the first front-side bonding pads 172, the first back-side insulating film 190, and the first back-side bonding pads 195, respectively.

The first and second semiconductor chips 100 and 200 may be bonded together in a Die-to-Wafer (D2W) method. For example, the first front-side bonding pads 172 of the first semiconductor chip 100 and the second back-side bonding pads 295 of the second semiconductor chip 200 may be bonded together, e.g., the first front-side bonding pads 172 and the second back-side bonding pads 295 may be directly connected to each other via direct surface contact between facing surfaces thereof. As a result, the first and second semiconductor chips 100 and 200 may be electrically connected. In detail, the first semiconductor element layer 120 and/or the first wiring structure 130 of the first semiconductor chip 100 may be electrically connected to the second semiconductor element layer 220 and/or the second wiring structure 230 of the second semiconductor chip 200 via the first connecting pads 142, the first front-side bonding pads 172, the second back-side bonding pads 295, and the second through vias 215.

For example, as illustrated in FIG. 2A, the width of the second back-side bonding pads 295, e.g., a maximal width along a surface contacting the first front-side bonding pads 172, may be the same as the width W21 of the first front-side bonding pads 172. In another example, the width of the second back-side bonding pads 295 may be less than, or greater than, the width W21 of the first front-side bonding pads 172.

The first test pads 144 of the first semiconductor chip 100 may not be electrically connected to the second semiconductor chip 200, e.g., the first test pads 144 may be electrically isolated from the second semiconductor chip 200. For example, as already mentioned above, parts of the second interlayer insulating film 156 may be formed in, e.g., completely fill, the test pad openings 174t, and the second back-side bonding pads 295 may not be connected to the first test pads 144.

In some embodiments, the first and second semiconductor chips 100 and 200 may be bonded via hybrid bonding. Hybrid bonding refers to a method that bonds a metal and an insulating film (e.g., an oxide film) or a metal and a polymer. For example, as illustrated in FIG. 2A, the first front-side bonding pads 172 may be attached to the second back-side bonding pads 295, and the second liner film 164 may be attached to the second back-side insulating film 290. For example, the first and second semiconductor chips 100 and 200 may be bonded via Cu-oxide hybrid bonding.

In other embodiments, the first and second semiconductor chips 100 and 200 may be bonded via metal bonding. For example, as illustrated in FIG. 2B, the first front-side bonding pads 172 may be attached to the second back-side bonding pads 295, and the second liner film 164 may be spaced apart from the second back-side insulating film 290. For example, the first and second semiconductor chips 100 and 200 may be bonded via Cu—Cu bonding.

As the demand for compactness, light weight, and multifunctionality for semiconductor packages has increased, there may be a limit in stacking semiconductor chips simply via a Chip-on-Wafer (CoW) method. For example, it may be difficult to secure proper thermal properties for connecting members, e.g., bumps or solder, because of a limit in smoothly releasing heat.

In contrast, according to example embodiments, the semiconductor chips (e.g., the first and second semiconductor chips 100 and 200) of the semiconductor package may be bonded together in the D2W method, thereby having improved thermal properties. For example, as already mentioned above, the first front-side bonding pads 172 of the first semiconductor chip 100 and the second back-side bonding pads 295 of the second semiconductor chip 200 may be, e.g., directly, bonded together and may include Cu, e.g., each of the first front-side bonding pads 172 and the second back-side bonding pads 295 may include Cu and may be bonded to each other via Cu—Cu bonding, which has a lower thermal resistance than connecting members, e.g., bumps or solder. Accordingly, a semiconductor package with improved thermal properties can be provided.

Also, the semiconductor package according to some embodiments of the present disclosure may include test pads (e.g., the first test pads 144) capable of providing a test function for a semiconductor chip (e.g., the first semiconductor chip 100). Accordingly, a semiconductor package that can facilitate a test process can be provided.

Figure 4:
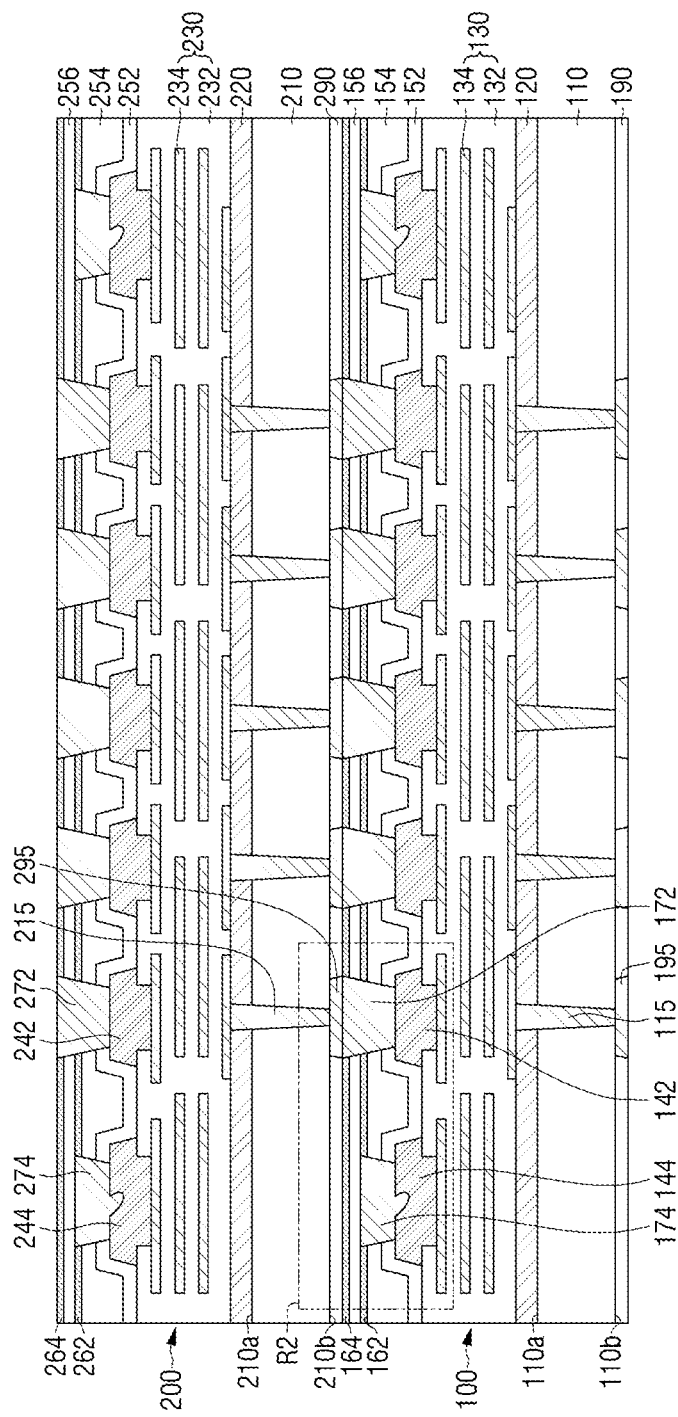
FIG. 4 is a cross-sectional view of a semiconductor package according to some embodiments of the present disclosure.
Figure 5:
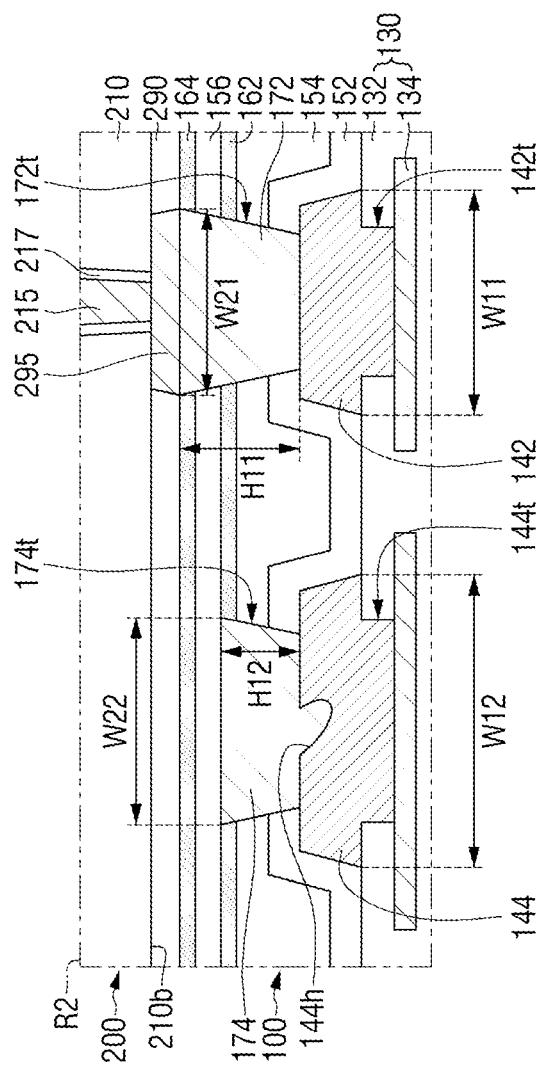
FIG. 5 is an enlarged cross-sectional view of area R2 of FIG. 4.
Figure 6:
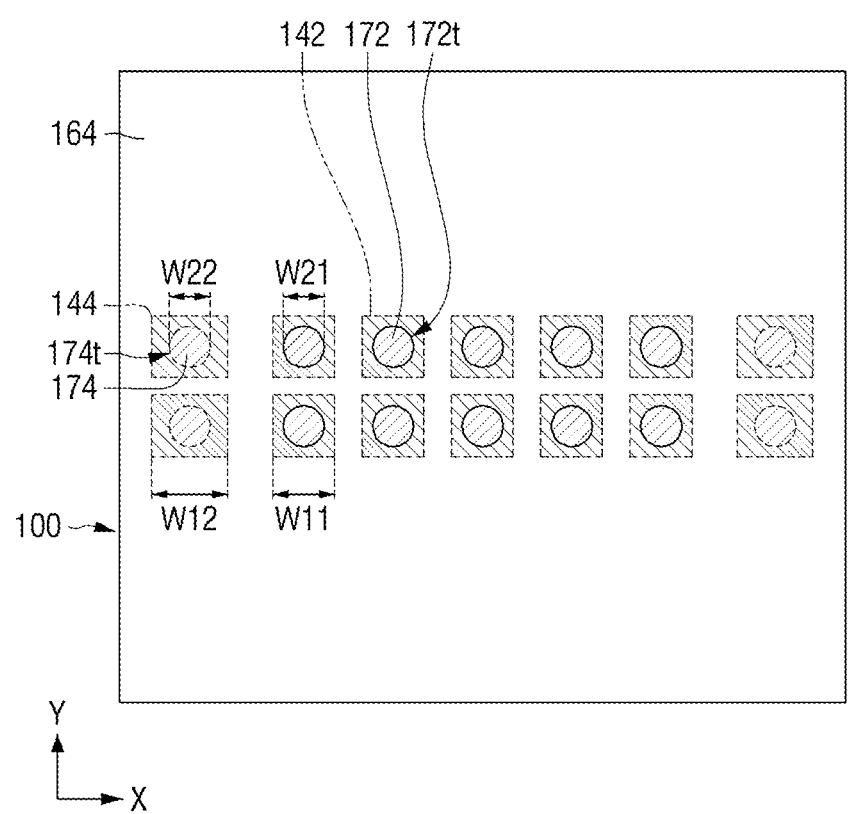
FIG. 6 is a plan view of first connecting pads and first test pads of FIG. 4.

FIG. 4 is a cross-sectional view of a semiconductor package according to some embodiments of the present disclosure. FIG. 5 is an enlarged cross-sectional view of area R2 of FIG. 4. FIG. 6 is a plan view illustrating first connecting pads and first test pads of FIG. 4. For convenience, descriptions of elements or features that have already been described above with reference to FIGS. 1 through 3B will be omitted or simplified.

Referring to FIGS. 4 through 6, the first semiconductor chip 100 may further include first dummy pads 174, and the second semiconductor chip 200 may further include second dummy pads 274. The first dummy pads 174 may be formed on the first test pads 144, and the second dummy pads 274 may be formed on the second test pads 244. The structure of the second dummy pads 274 may be identical to that of the first dummy pads 174.

In detail, the first dummy pads 174 may be formed on first test pads 144, and may be connected to the first test pads 144 through the first passivation film 152, the first interlayer insulating film 154, and the first liner film 162. For example, the first dummy pads 174 may be formed in the test pad openings 174t, e.g., completely fill the test pad openings 174t, and may be connected to the first test pads 144. The first dummy pads 174 may be exposed from the first liner film 162. For example, the top surfaces of the first dummy pads 174 may be disposed on the same plane as, e.g., coplanar with, the top surface of the first liner film 162. The first dummy pads 174 may include at least one of, e.g., W, Al, and Cu. For example, the first dummy pads 174 may include Cu.

For example, a width W22 of the first dummy pads 174 may be about 10 μm or less, e.g., about 5 μm to about 10 μm. In some embodiments, the width W22 of the first dummy pads 174 may be greater than a width W21 of first front-side bonding pads 172.

For example, a height H12 of the first dummy pads 174 may be about 5 μm or less, e.g., about 3 μm to about 5 μm. As the first front-side bonding pads 172 penetrate the second interlayer insulating film 156 and the second liner film 164 beyond the first liner film 162, a height H11 of the first front-side bonding pads 172 may be greater than the height H12 of the first dummy pads 174.

The first dummy pads 174 may not be electrically connected to the second semiconductor chip 200. For example, the second interlayer insulating film 156 may be formed on the first liner film 162 and the first dummy pads 174. The second interlayer insulating film 156 may cover the top surface of the first liner film 162 and the top surfaces of the first dummy pads 174. Accordingly, the second back-side bonding pads 295 may not be connected to the first test pads 144.

FIGS. 7 through 10 are cross-sectional views of semiconductor packages according to some embodiments of the present disclosure. For convenience, descriptions of elements or features that have already been described above with reference to FIGS. 1 through 6 will be omitted or simplified.

Figure 7:
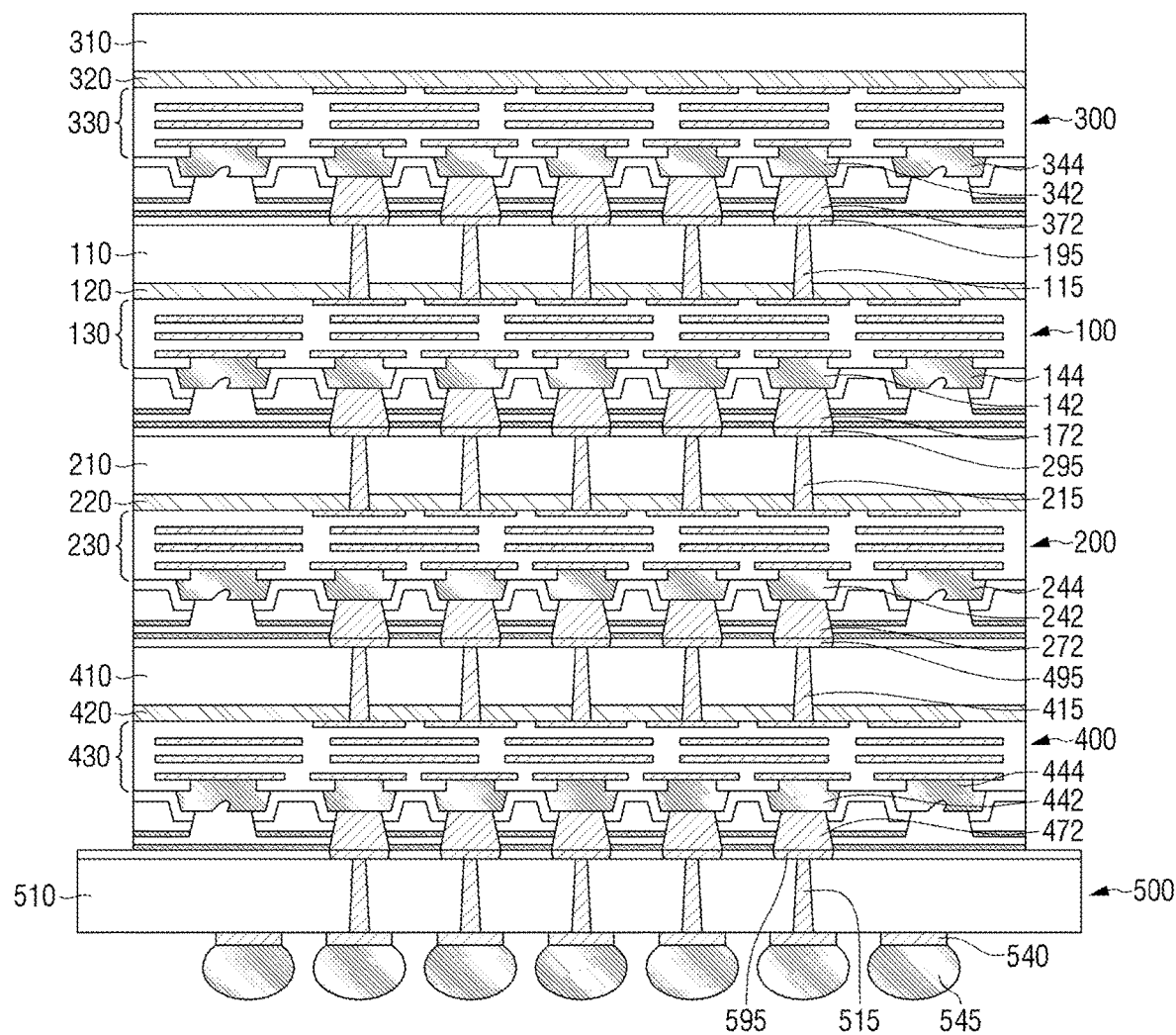
FIGS. 7 through 10 are cross-sectional views of semiconductor packages according to some embodiments of the present disclosure.
Figure 8:
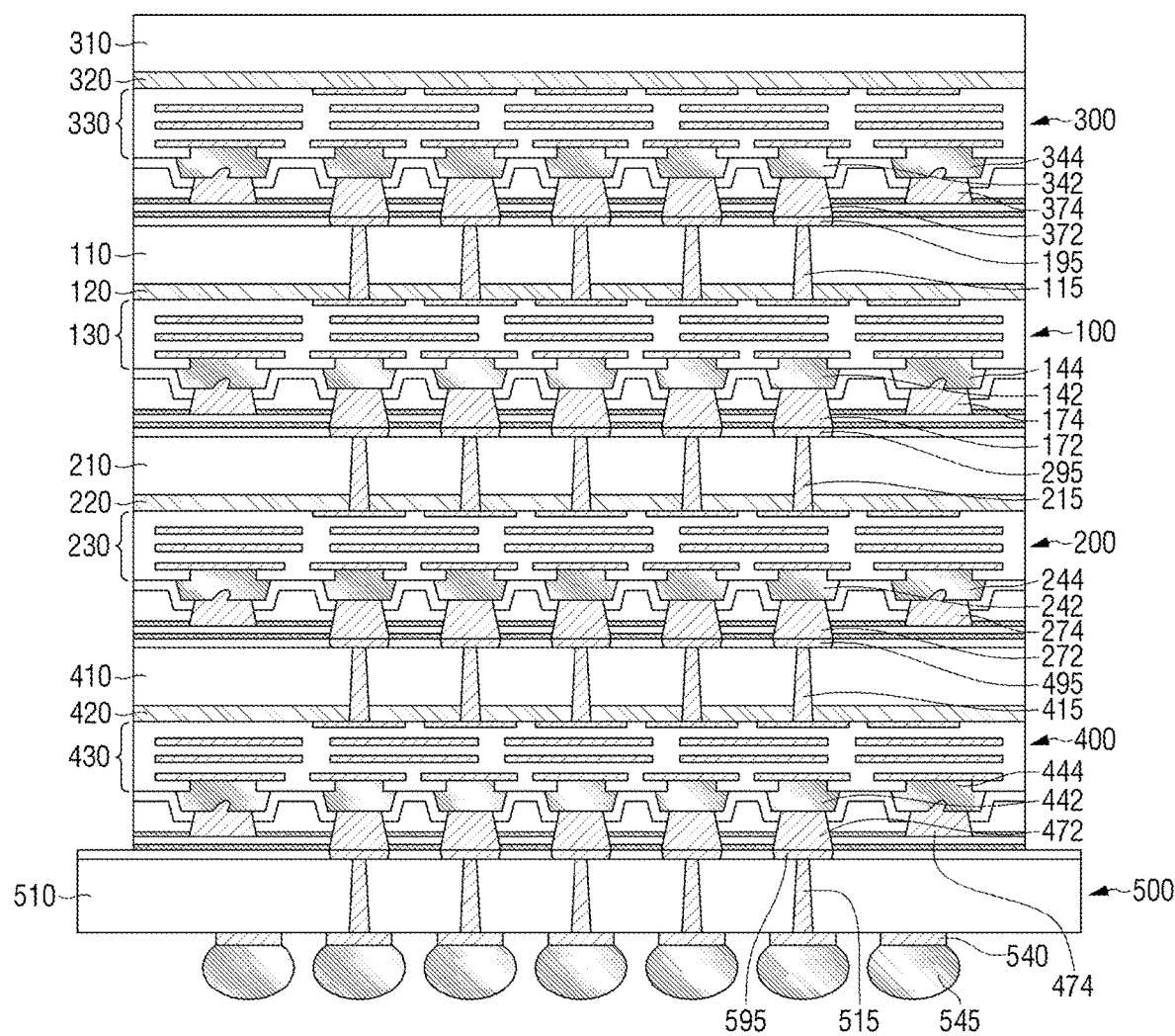

Referring to FIG. 7 or 8, the semiconductor package according to some embodiments of the present disclosure may include a base substrate 500 and a semiconductor chip stack (100, 200, 300, and 400).

The base substrate 500 may be a package substrate for forming a semiconductor package. For example, the base substrate 500 may be a printed circuit board (PCB), a ceramic substrate, or an interposer. In another example, the base substrate 500 may be a wafer level package (WLP) substrate fabricated on a wafer level. In yet another example, the base substrate 500 may be a semiconductor chip including semiconductor elements. The base substrate 500 will hereinafter be described as being a semiconductor chip including a base semiconductor substrate 510.

The semiconductor chip stack (100, 200, 300, and 400) may include a plurality of semiconductor chips, i.e., first, second, third, and fourth semiconductor chips 100, 200, 300, and 400, which are stacked. For example, the second semiconductor chip 200 may be stacked on the fourth semiconductor chip 400, the first semiconductor chip 100 may be stacked on the second semiconductor chip 200, and the third semiconductor chip 300 may be stacked on the first semiconductor chip 100. The semiconductor chip stack (100, 200, 300, and 400) may form a multi-chip semiconductor package, e.g., an HBM.

Each of the first, second, third, and fourth semiconductor chips 100, 200, 300, and 400 may include a semiconductor substrate 110, 210, 310, or 410, through vias 115, 215, 315, or 415, a semiconductor element layer 120, 220, 320, or 420, a wiring structure 130, 230, 330, or 430, connecting pads 142, 242, 342, or 442, test pads 144, 244, 344, or 444, front-side bonding pads 172, 272, 372, or 472, and back-side bonding pads 195, 295, 395, or 495. The semiconductor substrate 110, 210, 310, or 410, the through vias 115, 215, 315, or 415, the semiconductor element layer 120, 220, 320, or 420, the wiring structure 130, 230, 330, or 430, the connecting pads 142, 242, 342, or 442, the test pads 144, 244, 344, or 444, the front-side bonding pads 172, 272, 372, or 472, and the back-side bonding pads 195, 295, 395, or 495 may correspond to the first semiconductor substrate 110, the first through vias 115, the first semiconductor element layer 120, the first wiring structure 130, the first connecting pads 142, the first test pads 144, the first front-side bonding pads 172, and the first back-side bonding pads 195, respectively, of FIG. 1, and thus, detailed descriptions thereof will be omitted.

The semiconductor chip stack (100, 200, 300, and 400) may be stacked on the base substrate 500. For example, first base pads 595 may be formed on the top surface of the base semiconductor substrate 510. The fourth semiconductor chip 400 may be electrically connected to the base substrate 500 via the first base pads 595. For example, the front-side bonding pads 472 of the fourth semiconductor chip 400 may be, e.g., directly, connected to the first base pads 595 of the base substrate 500.

In some embodiments, the base substrate 500 may further include base through vias 515, second base pads 540, and base connecting members 545. The second base pads 540 may be formed on the bottom surface of the base semiconductor substrate 510. The base through vias 515 may connect the first base pads 595 and the second base pads 540 through the base semiconductor substrate 510. The base connecting members 545 may be connected to the second base pads 540. The semiconductor package according to some embodiments of the present disclosure may be electrically connected to an external device (e.g., a panel of an electronic device) via the base connecting members 545. The base connecting members 545 may include at least one of, e.g., solder balls, bumps, under bump metallurgy (UBM), and a combination thereof. For example, the base connecting members 545 may include metal, e.g., tin (Sn).

The test pads 144, the test pads 244, the test pads 344, and the test pads 444 may not be connected to the first, second, third, and fourth semiconductor chips 100, 200, 300, and 400, respectively, and vice versa. For example, as illustrated in FIG. 7, the test pads 144, the test pads 244, the test pads 344, and the test pads 444 may not be electrically connected to the back-side bonding pads 195, the back-side bonding pads 295, the back-side bonding pads 395, and the back-side bonding pads 495, respectively, due to insulating materials (e.g., the second interlayer insulating film 156 of FIG. 1).

Referring to FIG. 8, in some embodiments, each of the first, second, third, and fourth semiconductor chips 100, 200, 300, and 400 may further include dummy pads 174, 274, 374, or 474. The dummy pads 174, 274, 374, or 474 may correspond to the first dummy pads 174 of FIGS. 4 through 6, and thus, a detailed description thereof will be omitted.

Figure 9:
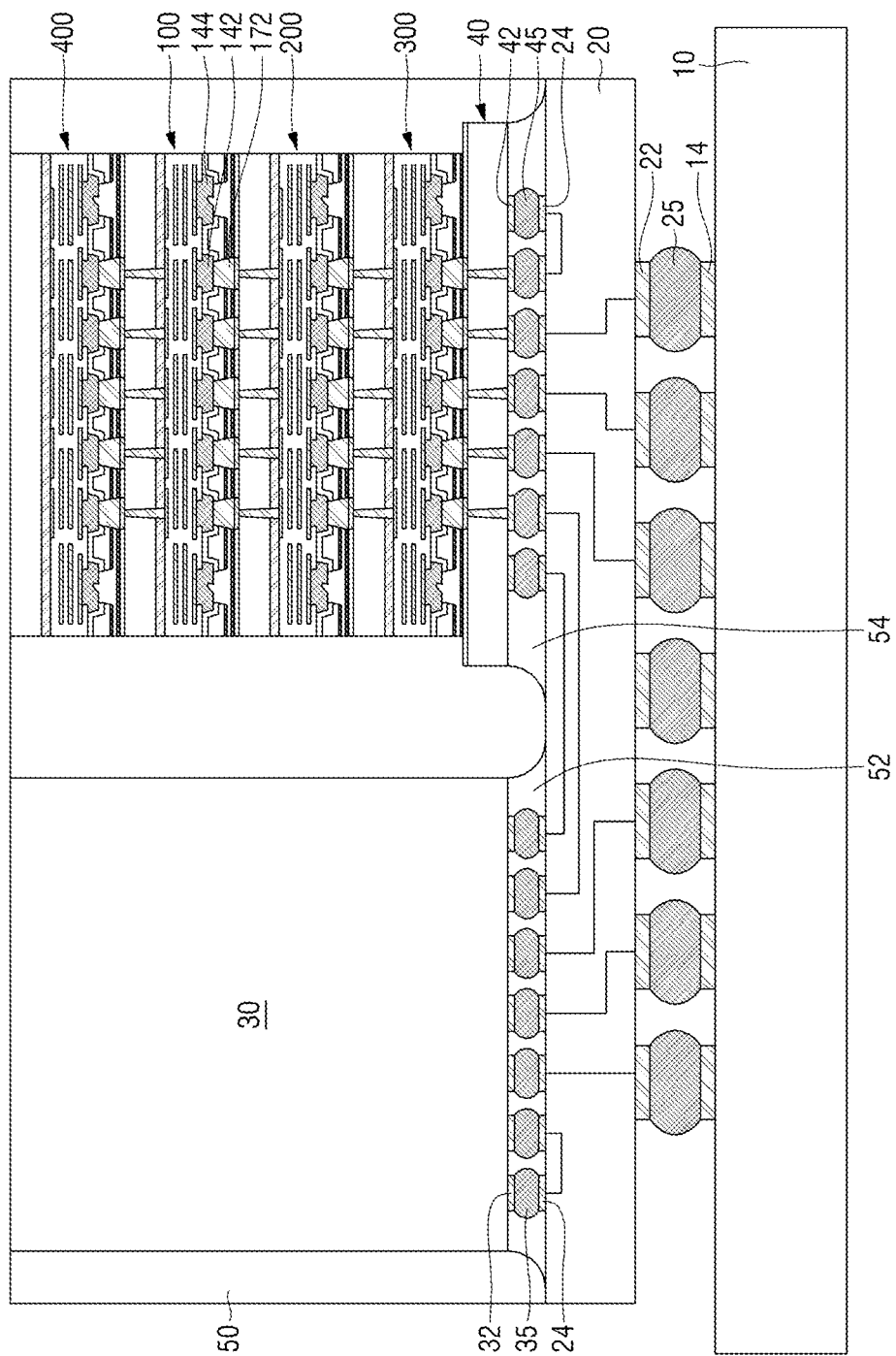
Figure 10:
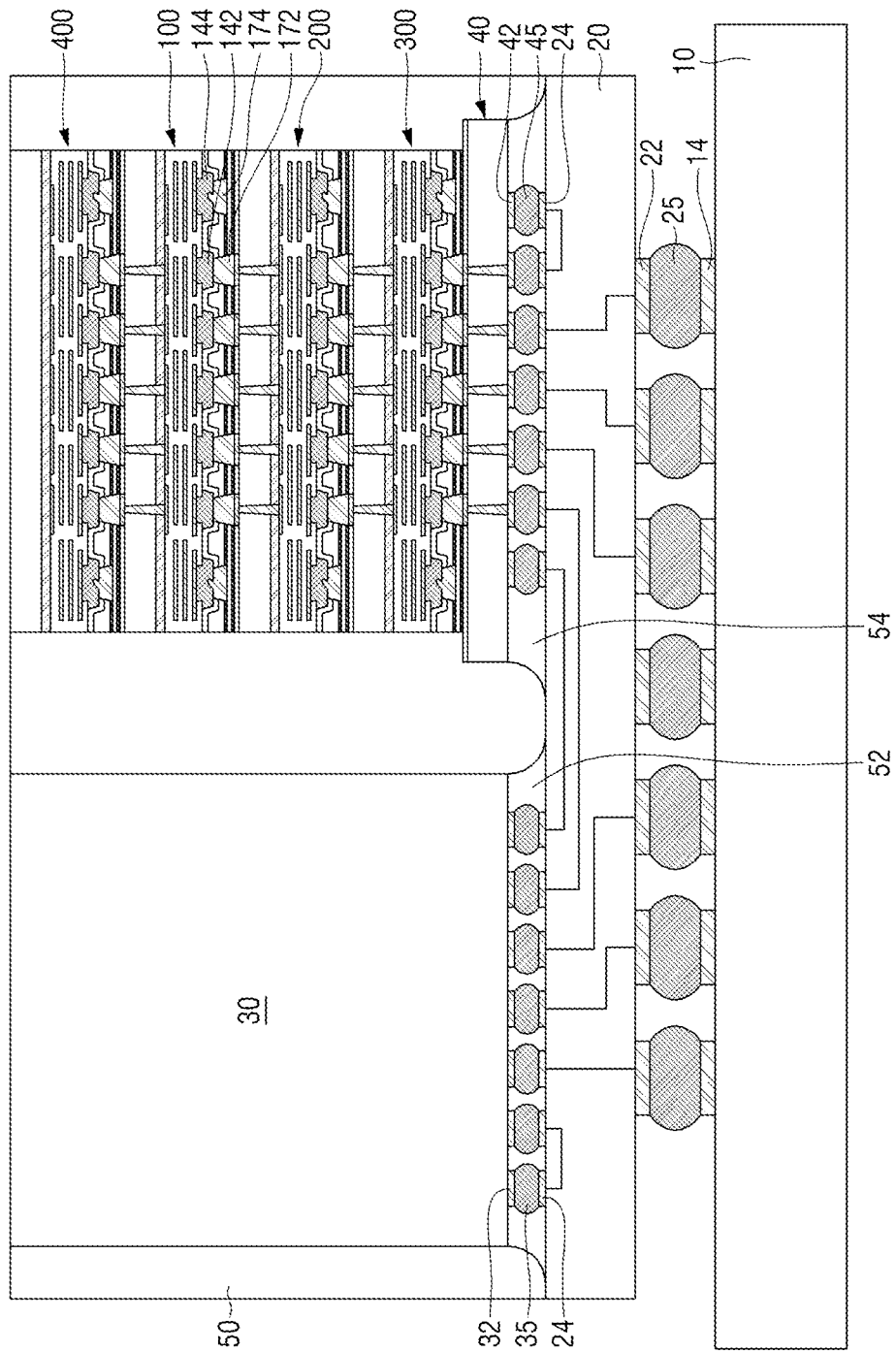

Referring to FIG. 9 or 10, a semiconductor package according to some embodiments of the present disclosure may include a PCB 10, an interposer 20, a logic semiconductor chip 30, and a molding member 50.

The interposer 20 may be stacked on the PCB 10. The interposer 20 may be electrically connected to the PCB 10. For example, substrate pads 14 may be formed on the top surface of the PCB 10, and first interposer pads 22 may be formed on the bottom surface of the interposer 20. The substrate pads 14 and the first interposer pads 22 may be connected to one another via first connecting members 25. The first connecting members 25 may include at least one of, e.g., solder balls, bumps, UBM, and a combination thereof. For example, the first connecting members 25 may include metal, e.g., Sn.

The interposer 20 may be interposed between the PCB 10 and a semiconductor chip stack (100, 200, 300, and 400). The semiconductor chip stack (100, 200, 300, and 400) may be stacked on the top surface of the interposer 20. The interposer 20 may be a silicon interposer or an organic interposer. In some embodiments, the interposer 20 may include a silicon interposer. The interposer 20 may facilitate the connection between the logic semiconductor chip 30 and the semiconductor chip stack (100, 200, 300, and 400), and may be used to reduce warpage of the semiconductor package according to some embodiments of the present disclosure.

The logic semiconductor chip 30 may be an integrated circuit (IC) obtained by integrating hundreds to millions of semiconductor elements into a single chip. The logic semiconductor chip 30 may be an AP, e.g., a CPU, a GPU, an FPGA, a DSP, a cryptographic processor, a microprocessor, a microcontroller, or an ASIC.

The logic semiconductor chip 30 may be mounted on the top surface of the interposer 20. For example, second interposer pads 24 may be formed on the top surface of the interposer 20, and first chip pads 32 may be formed on the bottom surface of the logic semiconductor chip 30. The second interposer pads 24 and the first chip pads 32 may be connected to one another via second connecting members 35. The second connecting members 35 may include at least one of, e.g., micro-bumps, UBM, and a combination thereof. For example, the second connecting members 35 may include metal, e.g., Sn.

In some embodiments, a first underfill 52 may be formed between the interposer 20 and the logic semiconductor chip 30. The first underfill 52 may fill the space between the interposer 20 and the logic semiconductor chip 30. Also, the first underfill 52 may cover the second connecting members 35. The first underfill 52 may prevent breakage of the logic semiconductor chip 30 by fixing the logic semiconductor chip 30 on the interposer 20. For example, the first underfill 52 may include an insulating polymer material, e.g., an epoxy molding compound (EMC).

The semiconductor chip stack (100, 200, 300, and 400) may form a multi-chip semiconductor package, e.g., an HBM. In some embodiments, a buffer semiconductor chip 40 may be interposed between the interposer 20 and the semiconductor chip stack (100, 200, 300, and 400). The buffer semiconductor chip 40 may facilitate the connection between the interposer 20 and the semiconductor chip stack (100, 200, 300, and 400) and the connection between the logic semiconductor chip 30 and the semiconductor chip stack (100, 200, 300, and 400). For example, the buffer semiconductor chip 40 may be an AP, e.g., a CPU, a GPU, an FPGA, a DSP, a cryptographic processor, a microprocessor, a microcontroller, or an ASIC.

The buffer semiconductor chip 40 may be mounted on the top surface of the interposer 20 to be spaced apart from the logic semiconductor chip 30. For example, second chip pads 42 may be formed on the bottom surface of the buffer semiconductor chip 40. The second interposer pads 24 and the second chip pads 42 may be connected to one another via third connecting members 45. The third connecting members 45 may include at least one of, e.g., micro-bumps, UBM, and a combination thereof. For example, the third connecting members 45 may include metal, e.g., Sn.

In some embodiments, a second underfill 54 may be formed between the interposer 20 and the buffer semiconductor chip 40. The second underfill 54 may fill the space between the interposer 20 and the buffer semiconductor chip 40. Also, the second underfill 54 may cover the third connecting members 45. The second underfill 54 may prevent breakage of the buffer semiconductor chip 40 by fixing the buffer semiconductor chip 40 on the interposer 20. For example, the second underfill 54 may include an insulating polymer material, e.g., EMC.

The molding member 50 may be formed on the top surface of the interposer 20. The molding member 50 may cover at least parts of the logic semiconductor chip 30 and at least parts of the semiconductor chip stack (100, 200, 300, and 400). For example, the molding member 50 may cover the side surfaces of the logic semiconductor chip 30 and the side surfaces of the semiconductor chip stack (100, 200, 300, and 400). The molding member 50 is illustrated as exposing only the top surfaces of the logic semiconductor chip 30 and the semiconductor chip stack (100, 200, 300, and 400). Alternatively, the molding member 50 may also cover the top surfaces of the logic semiconductor chip 30 and the semiconductor chip stack (100, 200, 300, and 400).

For example, the molding member 50 may include an insulating polymer material, e.g., EMC. In some embodiments, the first and second underfills 52 and 54 may include a different material from the molding member 50. For example, the first and second underfills 52 and 54 may include an insulating material with more fluidity than the molding member 50. Accordingly, the first and second underfills 52 and 54 may effectively fill the narrow space between the interposer 20 and the logic semiconductor chip 30 and/or between the interposer 20 and the semiconductor chip stack (100, 200, 300, and 400).

A method of fabricating a semiconductor package according to some embodiments of the present disclosure will hereinafter be described with reference to FIGS. 1 through 23.

FIGS. 11 through 20 are cross-sectional views of stages in a method of fabricating a semiconductor package according to some embodiments of the present disclosure. For convenience, descriptions of elements or features that have already been described above with reference to FIGS. 1 through 10 will be omitted or simplified.

Figure 11:
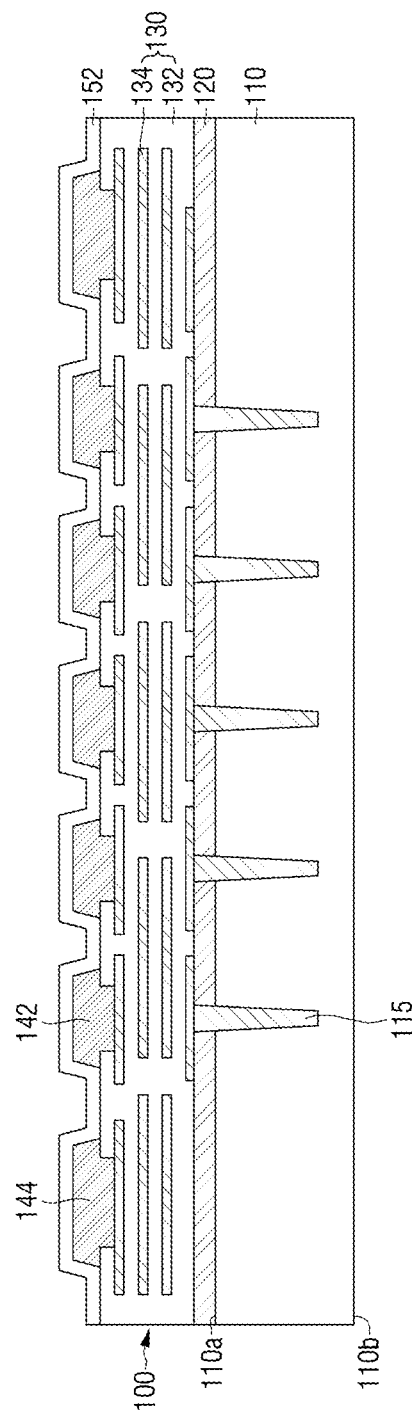
FIGS. 11 through 20 are cross-sectional views of stages in a method of fabricating a semiconductor package according to some embodiments of the present disclosure.

Referring to FIG. 11, the first through vias 115, the first semiconductor element layer 120, the first wiring structure 130, the first connecting pads 142, the first test pads 144, and the first passivation film 152 may be formed on the first semiconductor substrate 110.

For example, the first semiconductor substrate 110 having the first and second surfaces 110*a* and 110*b* may be provided. The first semiconductor element layer 120 may be formed on the first surface 110*a* of the first semiconductor substrate 110. The first through vias 115 may be formed in, e.g., through, the first semiconductor substrate 110 and the first semiconductor element layer 120. The first wiring structure 130 may be formed on the first semiconductor element layer 120. The first connecting pads 142 and the first test pads 144 may be spaced apart from one another and may be formed on the first wiring structure 130.

Thereafter, the first passivation film 152 may be formed on the first wiring structure 130, the first connecting pads 142, and the first test pads 144. The first passivation film 152 may extend conformally along the profiles of the first wiring structure 130, the first connecting pads 142, and the first test pads 144. The first passivation film 152 may be formed by high-density plasma chemical vapor deposition (HDPCVD).

Figure 12:
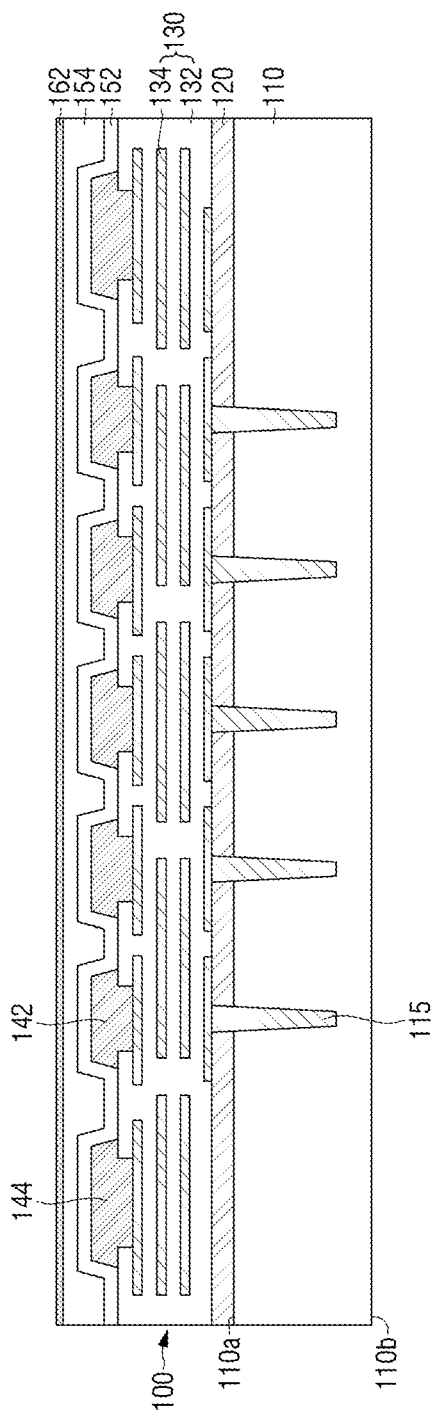

Referring to FIG. 12, the first interlayer insulating film 154 and the first liner film 162 may be sequentially formed on the first passivation film 152.

For example, the first interlayer insulating film 154, which covers the first passivation film 152, may be formed. The first interlayer insulating film 154 may be formed by, e.g., plasma-enhanced chemical vapor deposition (PECVD), low-temperature chemical vapor deposition (LTCVD), or atomic layer deposition (ALD). The first interlayer insulating film 154 may include at least one of, e.g., silicon oxide, silicon nitride, and silicon oxynitride. For example, the first interlayer insulating film 154 may include TEOS.

Thereafter, the first liner film 162, which covers the first interlayer insulating film 154, may be formed. In some embodiments, the first interlayer insulating film 154 may be planarized before the formation of the first liner film 162. The first interlayer insulating film 154 may be planarized by, e.g., chemical mechanical polishing (CMP). The first interlayer insulating film 154 may extend along the planarized top surface of the first interlayer insulating film 154. The first liner film 162 may include at least one of, e.g., silicon oxide, silicon nitride, and silicon oxynitride. For example, the first liner film 162 may include a SiN film.

Figure 13:
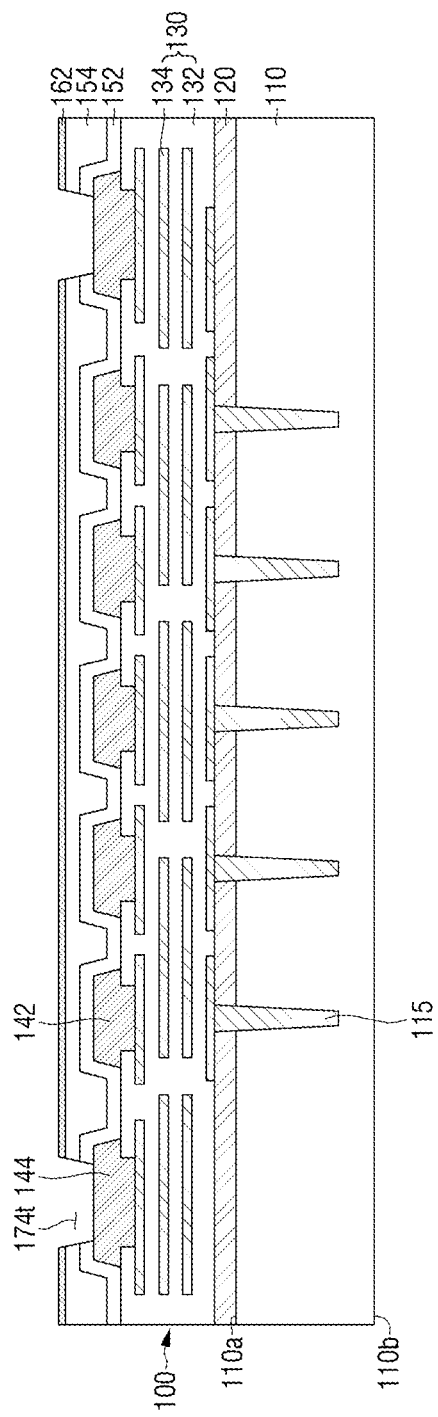

Referring to FIG. 13, test pad openings 174*t* are formed in the first interlayer insulating film 154 and the first liner film 162.

For example, an etching process may be performed to expose at least parts of the top surfaces of the first test pads 144. The etching process may include a dry etching process for the first interlayer insulating film 154 and the first liner film 162. As a result, the test pad openings 174*t*, which expose at least parts of the top surfaces of the first test pads 144 through the first interlayer insulating film 154 and the first liner film 162, may be formed.

Figure 14:
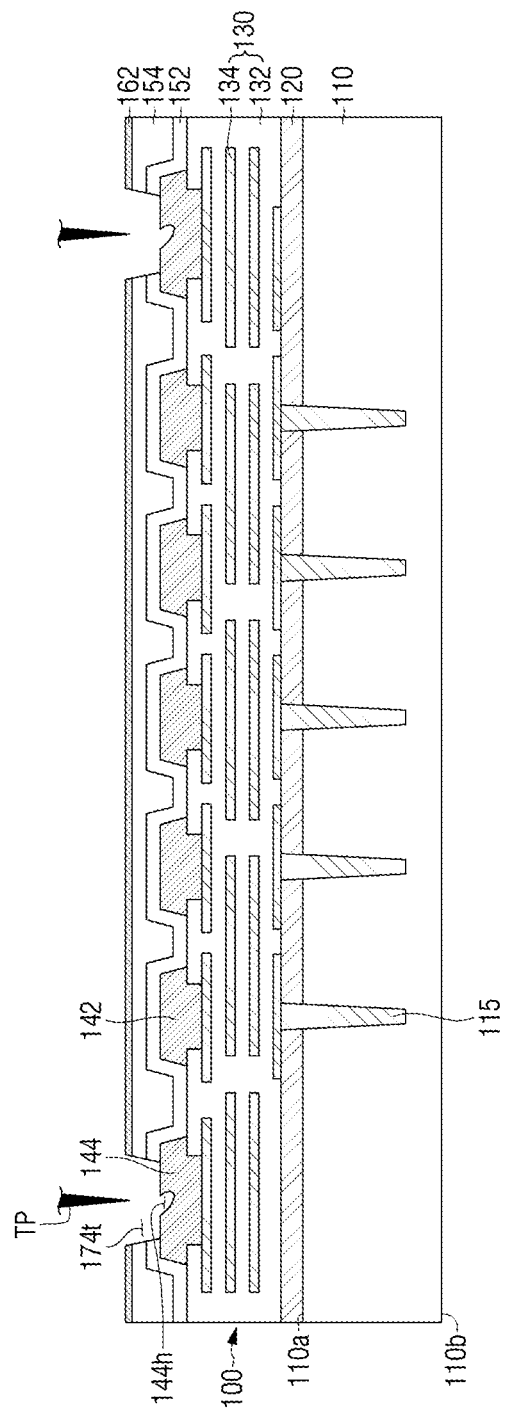

Referring to FIG. 14, a test process for the first test pads 144 may be performed using the test pad openings 174*t*. The test process may be performed to test the functions and the electrical connection of the first semiconductor chip 100.

For example, test equipment including probes TP may be provided. The test equipment may perform a test process by placing the probes TP in physical contact with the first test pads 144. This type of contact test process may have higher performance than a non-contact test process.

In some embodiments, grooves 144h may be formed in the first test pads 144. For example, as the probes TP are in physical contact with the first test pads 144 during a test process, the grooves 144h may be formed on the top surface of the first test pads 144.

Figure 15:
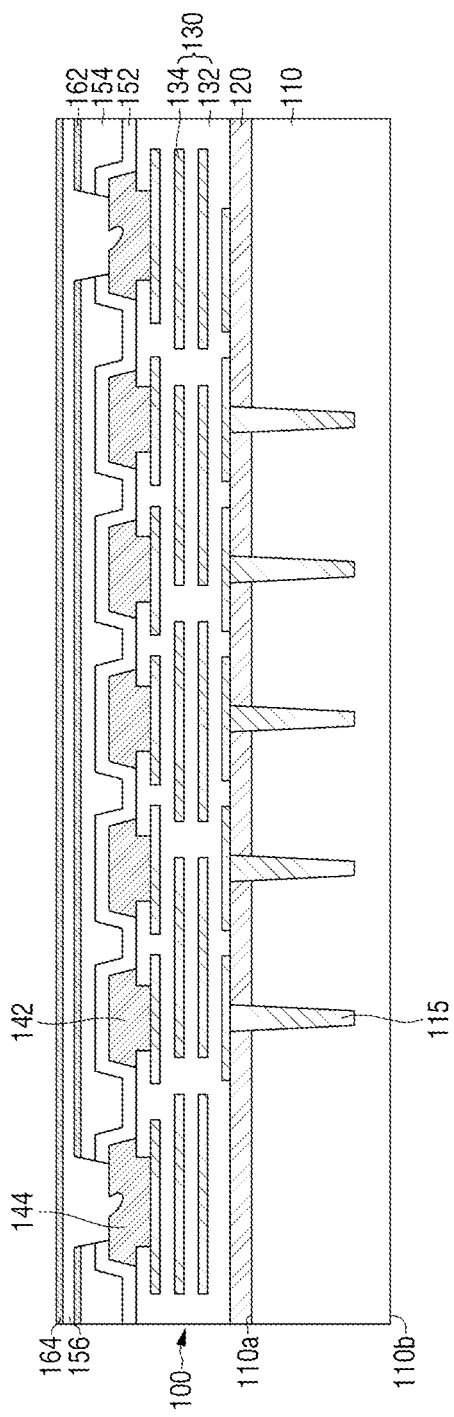

Referring to FIG. 15, the second interlayer insulating film 156 and the second liner film 164 may be sequentially formed on the first liner film 162.

For example, the second interlayer insulating film 156, which covers the first liner film 162, may be formed. The second interlayer insulating film 156 may be formed by PECVD, LTCVD, or ALD.

The second interlayer insulating film 156 may include at least one of, e.g., silicon oxide, silicon nitride, and silicon oxynitride. For example, the second interlayer insulating film 156 may include TEOS.

In some embodiments, the second interlayer insulating film 156 may fill the test pad openings 174t of FIG. 14. Accordingly, parts of the second interlayer insulating film 156 may be in contact with the first test pads 144.

Thereafter, the second liner film 164, which covers the second interlayer insulating film 156, may be formed. In some embodiments, the second interlayer insulating film 156 may be planarized before the formation of the second liner film 164. The second interlayer insulating film 156 may be planarized by CMP. The second liner film 164 may extend along the planarized top surface of the second interlayer insulating film 156.

The second liner film 164 may include at least one of, e.g., silicon oxide, silicon nitride, and silicon oxynitride. For example, the second liner film 164 may include a SiCN film.

Figure 16:
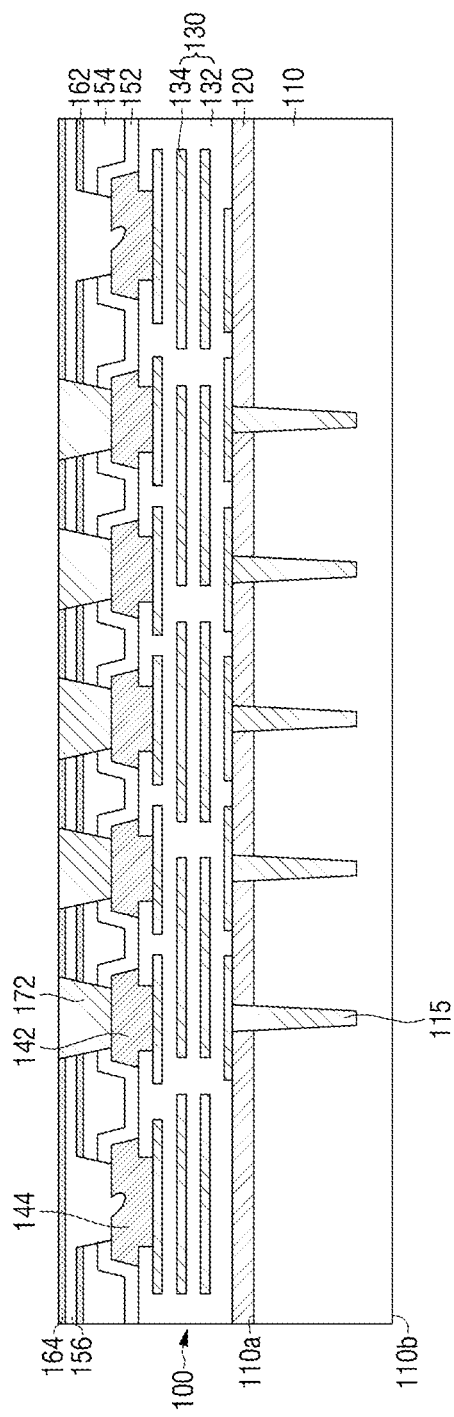

Referring to FIG. 16, the first front-side bonding pads 172, which are connected to the first connecting pads 142, are formed.

For example, openings (e.g., the connecting pad openings 172t of FIGS. 2A and 2B), which expose at least parts of the top surfaces of the first connecting pads 142 through the first passivation film 152, the first interlayer insulating film 154, the first liner film 162, the second interlayer insulating film 156, and the second liner film 164, may be formed. Thereafter, a conductive film may be formed on the second liner film 164 to fill the openings. The conductive film may be formed by, e.g., a damascene process.

Thereafter, the conductive film may be planarized. The conductive film may be planarized by, e.g., CMP. In some embodiments, the second liner film 164 may be used as an etch stopper during the planarization of the conductive film. As a result, the first front-side bonding pads 172, whose top surfaces are disposed on the same plane as the top surface of the second liner film 164, may be formed.

The first front-side bonding pads 172 may include at least one of, e.g., W, Al, and Cu. For example, the first front-side bonding pads 172 may include Cu.

Figure 17:
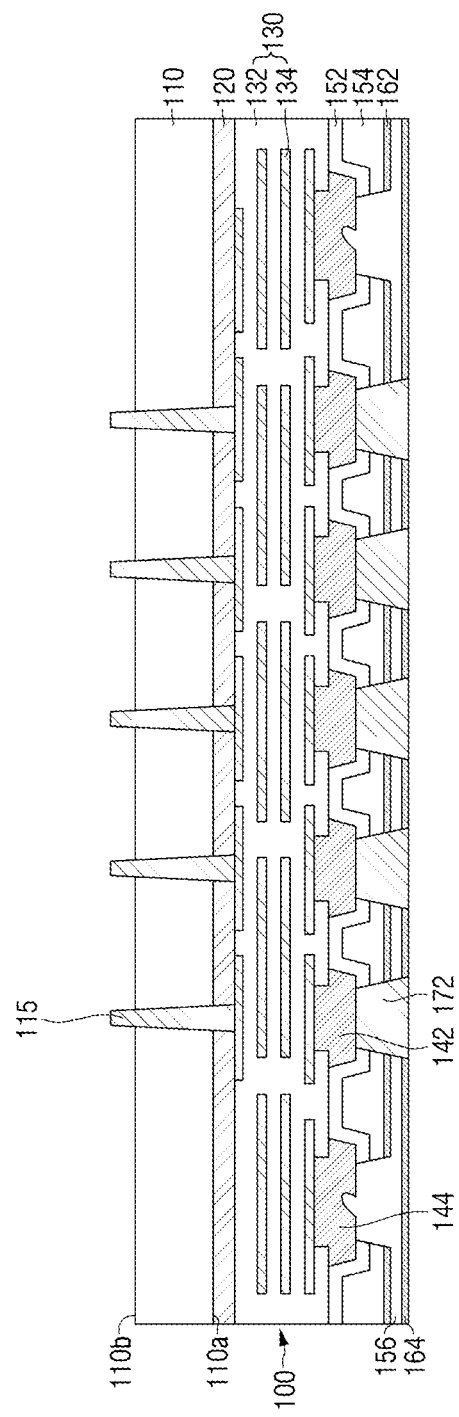

Referring to FIG. 17, a recess process is performed on the second surface 110b of the first semiconductor substrate 110.

For example, a back grinding process may be performed on the second surface 110b of the first semiconductor substrate 110. As a result of the recess process, parts of the first through vias 115 may be exposed. For example, the recess process may be performed until the second surface 110b of the first semiconductor substrate 110 becomes lower than the top surfaces of the first through vias 115. In this example, first through vias 115 that protrude beyond, e.g., above, the second surface 110b of the first semiconductor substrate 110 may be formed.

Figure 18:
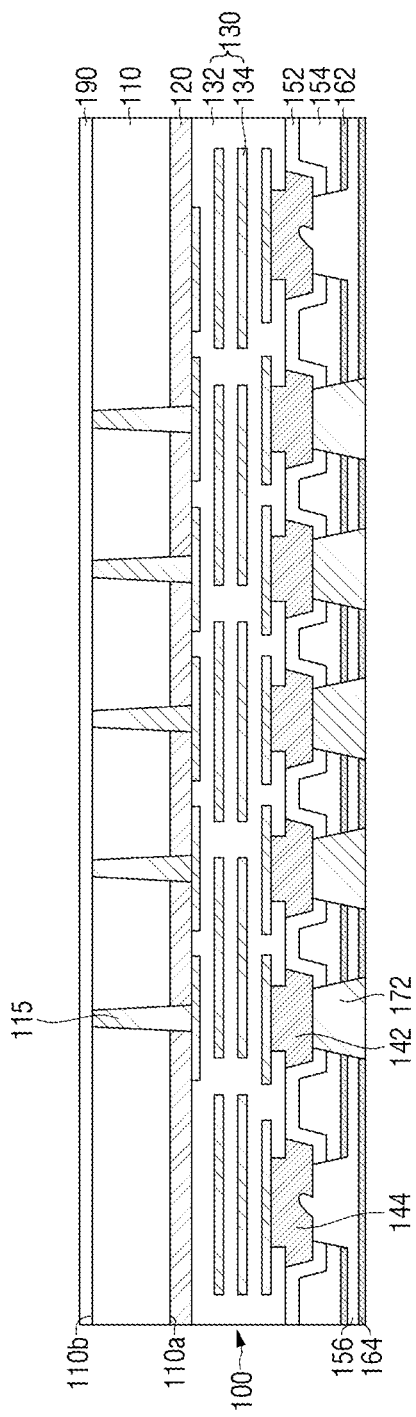

Referring to FIG. 18, the first back-side insulating film 190 is formed on the second surface 110b of the first semiconductor substrate 110.

For example, the first through vias 115 may be planarized. The first through vias 115 may be planarized by, e.g., CMP. As a result, protruding parts of the first through vias 115 may be removed. Thereafter, the first back-side insulating film 190, which covers the second surface 110b of the first semiconductor substrate 110 and the first through vias 115, may be formed. The first back-side insulating film 190 may be formed by, e.g., CVD.

Figure 19:
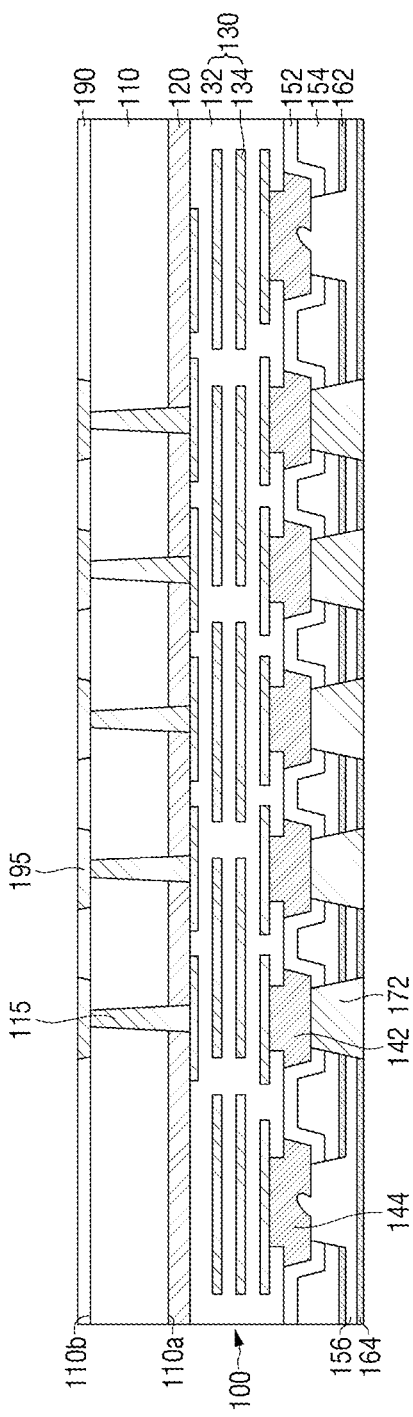

Referring to FIG. 19, the first back-side bonding pads 195, which are connected to the first through vias 115, are formed.

For example, openings, which expose at least parts of the top surfaces of the first through vias 115 through the first back-side insulating film 190, may be formed. Thereafter, a conductive film may be formed to fill the openings. The conductive film may be formed by, e.g., a damascene process.

Thereafter, the conductive film may be planarized. The conductive film may be planarized by, e.g., CMP. As a result, the first back-side bonding pads 195, whose top surfaces are disposed on the same plane as the top surface of the first back-side insulating film 190, may be formed.

The first back-side bonding pads 195 may include at least one of, e.g., W, Al, and Cu. For example, the first back-side bonding pads 195 may include Cu.

In this manner, the first semiconductor chip 100 of FIG. 1 may be obtained.

Figure 20:
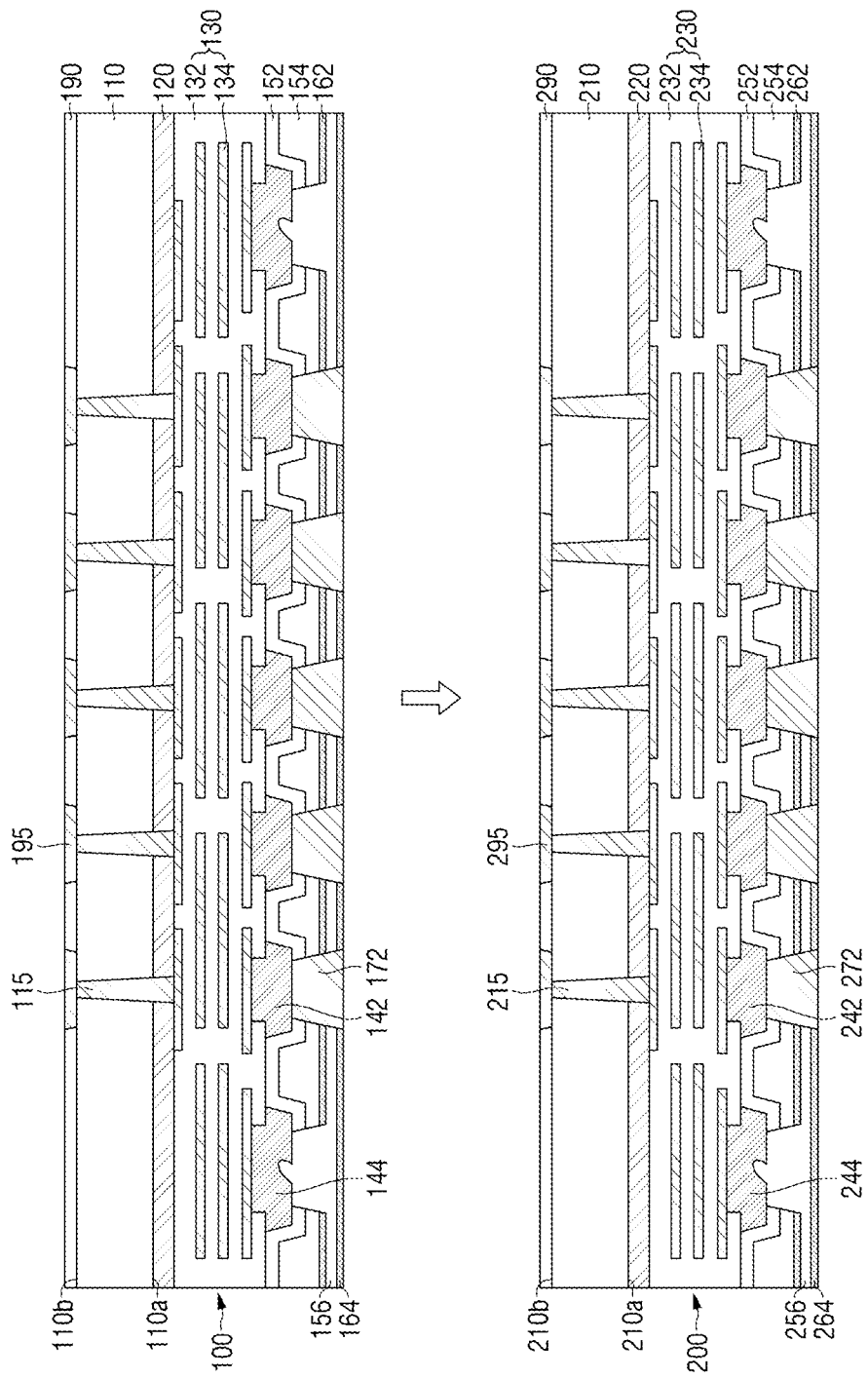

Referring to FIG. 20, the first semiconductor chip 100 and the second semiconductor chip 200 may be bonded together. The second semiconductor chip 200 may be fabricated in a similar manner to the first semiconductor chip 100, and as a result, a detailed description of how to fabricate the second semiconductor chip 200 will be omitted.

The first and second semiconductor chips 100 and 200 may be bonded together in a D2W method. For example, the first front-side bonding pads 172 of the first semiconductor chip 100 and the second back-side bonding pads 295 of the second semiconductor chip 200 may be bonded. As a result, the first and second semiconductor chips 100 and 200 may be electrically connected.

Figure 21:
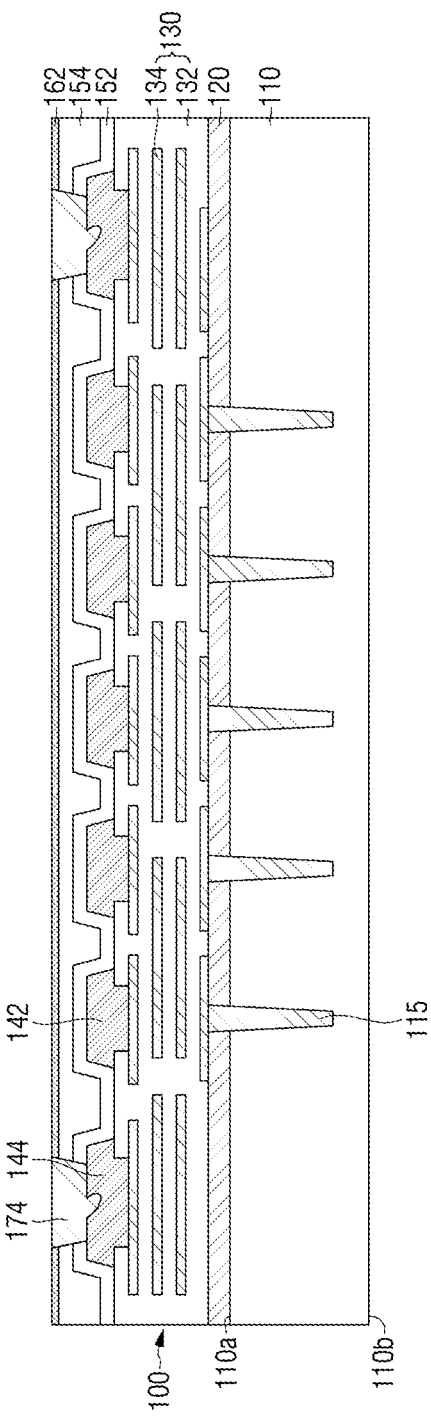
FIGS. 21 through 23 are cross-sectional views of stages in a method of fabricating a semiconductor package according to some embodiments of the present disclosure.
Figure 22:
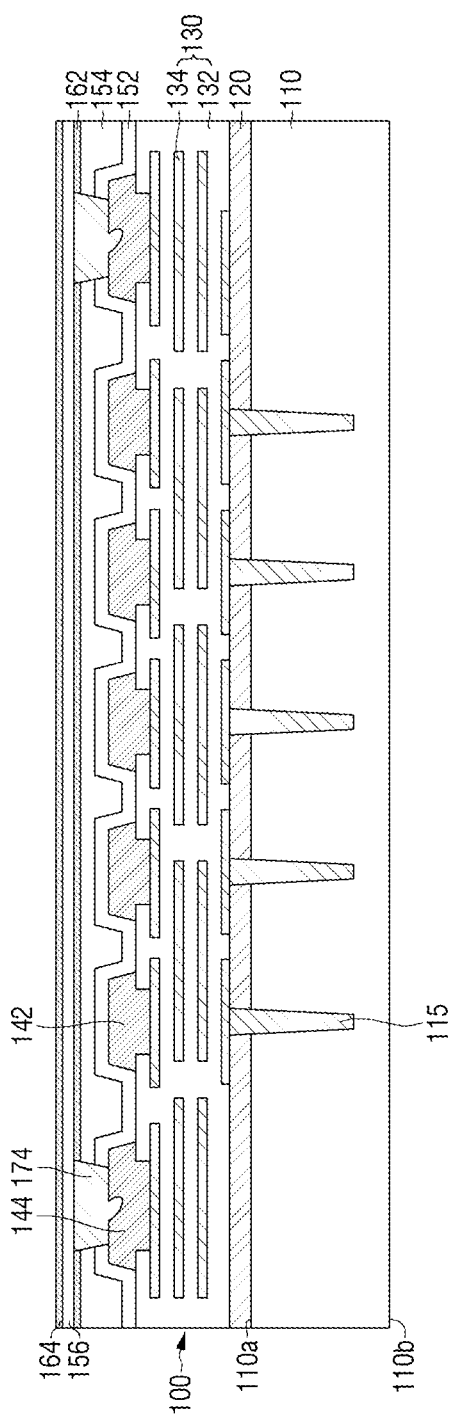
Figure 23:
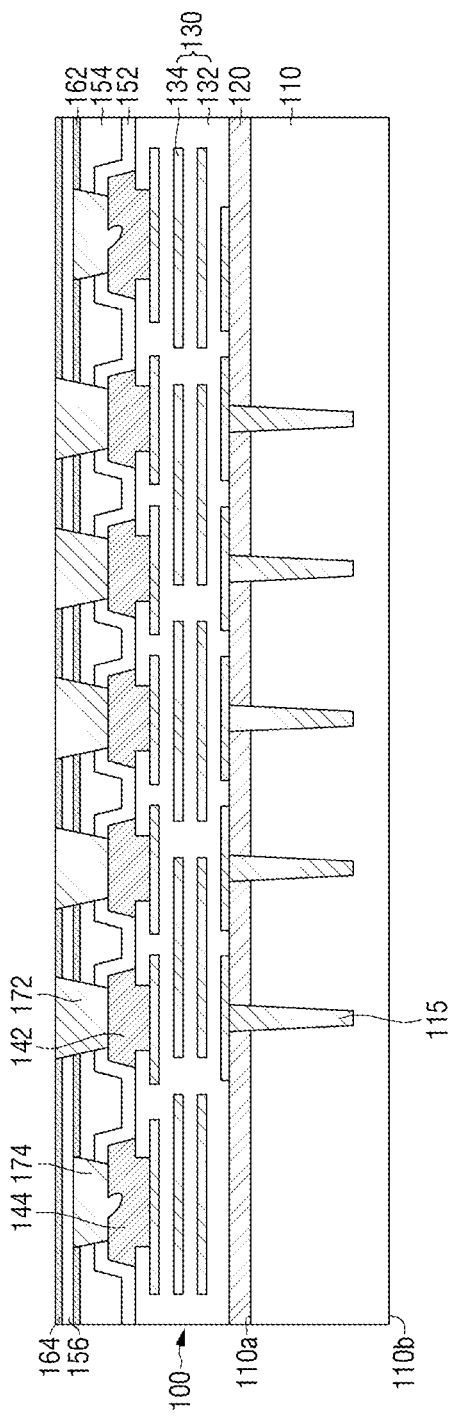

FIGS. 21 through 23 are cross-sectional views of stages in a method of fabricating a semiconductor package according to some embodiments of the present disclosure. For convenience, descriptions of elements or features that have already been described above with reference to FIGS. 1 through 20 will be omitted or simplified. FIG. 21 illustrates a step of the method of fabricating a semiconductor package according to some embodiments of the present disclosure that follows FIG. 14.

Referring to FIG. 21, the first dummy pads 174, which are connected to first test pads 144, are formed. For example, a conductive film may be formed to fill the test pad openings 174t. The conductive film may be formed by, e.g., a damascene process.

Thereafter, the conductive film may be planarized. The conductive film may be planarized by, e.g., CMP. In some embodiments, the first liner film 162 may be used as an etch stopper during the planarization of the conductive film. As a result, the first dummy pads 174, whose top surfaces are disposed on the same plane as the top surface of the first liner film 162, may be formed.

The first dummy pads 174 may include at least one of, e.g., W, Al, and Cu. For example, the first dummy pads 174 may include Cu.

Referring to FIG. 22, the second interlayer insulating film 156 and the second liner film 164 are sequentially formed on the first liner film 162 and the first dummy pads 174. The formation of the second interlayer insulating film 156 and the second liner film 164 is similar to the formation of the second interlayer insulating film 156 and the second liner film 164 of FIG. 15, and thus, a detailed description thereof will be omitted.

Referring to FIG. 23, the first front-side bonding pads 172, which are connected to the first connecting pads 142, are formed. The formation of the first front-side bonding pads 172 is similar to the formation of the first front-side bonding pads 172 of FIG. 15, and thus, a detailed description thereof will be omitted.

Thereafter, the steps of FIGS. 17 through 20 may be performed. In this manner, the semiconductor package of FIGS. 4 through 6 may be obtained.

By way of summation and review, embodiments of the present disclosure provide a semiconductor package with improved thermal properties. Embodiments of the present disclosure also provide a method of fabricating a semiconductor package with improved thermal properties.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first semiconductor chip including:
a first semiconductor substrate, the first semiconductor substrate having first and second surfaces that are opposite to each other,
a first semiconductor element layer and a first wiring structure, which are sequentially stacked on the first surface of the first semiconductor substrate,
first connecting pads and first test pads on the first wiring structure, the first connecting pads and the first test pads being connected to the first wiring structure, and
first front-side bonding pads connected to the first connecting pads; and
a second semiconductor chip bonded to the first semiconductor chip, the second semiconductor chip including:
a second semiconductor substrate, the second semiconductor substrate having a third surface and a fourth surface that are opposite to each other, and the fourth surface facing the first surface of the first semiconductor substrate,
a second semiconductor element layer and a second wiring structure, which are sequentially stacked on the third surface of the second semiconductor substrate, and
first back-side bonding pads on the fourth surface of the second semiconductor substrate, the first back-side bonding pads being bonded to the first front-side bonding pads of the first semiconductor chip,
wherein the first test pads of the first semiconductor chip are not electrically connected to the second semiconductor chip.

2. The semiconductor package as claimed in claim 1, wherein:
the first semiconductor chip further includes a first interlayer insulating film, a first liner film, a second interlayer insulating film, and a second liner film, which are sequentially stacked on the first wiring structure, and
the first front-side bonding pads are connected to the first connecting pads through the first interlayer insulating film, the first liner film, the second interlayer insulating film, and the second liner film.

3. The semiconductor package as claimed in claim 2, wherein the second semiconductor chip further includes a back-side insulating film, which is on the fourth surface of the second semiconductor substrate and is bonded to the second liner film.

4. The semiconductor package as claimed in claim 2, wherein:
the first interlayer insulating film and the second interlayer insulating film include silicon oxide films, and
the first liner film and the second liner film include silicon nitride films.

5. The semiconductor package as claimed in claim 2, wherein parts of the second interlayer insulating film are in contact with the first test pads through the first interlayer insulating film and the first liner film.

6. The semiconductor package as claimed in claim 1, wherein:
the first semiconductor chip further includes dummy pads, which are connected to the first test pads, and
a height of the first front-side bonding pads is greater than a height of top surfaces of the dummy pads.

7. The semiconductor package as claimed in claim 1, wherein the first semiconductor chip further includes:
second back-side bonding pads, which are on the second surface of the first semiconductor substrate, and
through vias, which connect the first wiring structure and the second back-side bonding pads through the first semiconductor substrate.

8. The semiconductor package as claimed in claim 1, wherein the second semiconductor chip further includes through vias, which connect the second wiring structure and the first back-side bonding pads through the second semiconductor substrate.

9. The semiconductor package as claimed in claim 8, wherein the second semiconductor chip further includes:
second connecting pads and second test pads, which are connected to the second wiring structure, on the second wiring structure, and
second front-side bonding pads, which are connected to the second connecting pads and are not connected to the second test pads.

10. A semiconductor package, comprising:
a semiconductor substrate having a first surface and a second surface, which are opposite to each other;
a semiconductor element layer and a wiring structure sequentially stacked on the first surface of the semiconductor substrate;
connecting pads connected to the wiring structure, on a top surface of the wiring structure;
test pads spaced apart from the connecting pads and connected to the wiring structure, on the top surface of the wiring structure;
first and second liner films sequentially stacked on the top surface of the wiring structure;

connecting pad openings exposing the connecting pads through the first and second liner films;

test pad openings exposing the test pads through the first liner film, and not penetrating the second liner film; and front-side bonding pads connected to the connecting pads in the connecting pad openings.

11. The semiconductor package as claimed in claim 10, further comprising:

a first interlayer insulating film between the wiring structure and the first liner film; and a second interlayer insulating film between the first and second liner films, wherein the first and second interlayer insulating films include silicon oxide films, and wherein the first and second liner films include silicon nitride films.

12. The semiconductor package as claimed in claim 11, wherein the first liner film includes a SiN film, and the second liner film includes a SiCN film.

13. The semiconductor package as claimed in claim 10, wherein the connecting pads and the test pads include aluminum (Al), and the front-side bonding pads include copper (Cu).

14. The semiconductor package as claimed in claim 10, wherein top surfaces of the front-side bonding pads are on a same plane as a top surface of the second liner film.

15. The semiconductor package as claimed in claim 10, further comprising dummy pads connected to the test pads in the test pad openings, top surfaces of the dummy pads being on a same plane as a top surface of the first liner film.

16. The semiconductor package as claimed in claim 10, further comprising:

a back-side insulating film covering the second surface of the semiconductor substrate;

back-side bonding pads exposing from the back-side insulating film, on the second surface of the semiconductor substrate; and through vias connecting the wiring structure and the back-side bonding pads through the semiconductor substrate.

17. The semiconductor package as claimed in claim 10, wherein a width of the test pads is greater than a width of the connecting pads.

18. The semiconductor package as claimed in claim 10, wherein top surfaces of the test pads include grooves.

19. A semiconductor package, comprising:

a base substrate; and semiconductor chips sequentially stacked on the base substrate, each of the semiconductor chips including:

a semiconductor substrate, which has a first surface that faces a top surface of the base substrate and a second surface that is opposite to the first surface, a semiconductor element layer and a wiring structure, which are sequentially stacked on the first surface of the semiconductor substrate, connecting pads and test pads, which are connected to the wiring structure and are exposed from the wiring structure, front-side bonding pads, which are connected to the connecting pads and are not connected to the test pads, back-side bonding pads, which are on the second surface of the semiconductor substrate, and through vias, which connect the wiring structure and the back-side bonding pads through the semiconductor substrate.

20. The semiconductor package as claimed in claim 19, wherein:

each of the semiconductor chips includes first and second semiconductor chips, which are bonded together, the front-side bonding pads of the first semiconductor chip and the back-side bonding pads of the second semiconductor chip are bonded together, and the test pads of the first semiconductor chip are not electrically connected to the second semiconductor chip.

* * * * *